(12) United States Patent
Park et al.

(10) Patent No.: US 10,096,649 B2
(45) Date of Patent: Oct. 9, 2018

(54) REDUCING OR AVOIDING METAL DEPOSITION FROM ETCHING MAGNETIC TUNNEL JUNCTION (MTJ) DEVICES, INCLUDING MAGNETIC RANDOM ACCESS MEMORY (MRAM) DEVICES

(71) Applicant: QUALCOMM Incorporated, San Diego, CA (US)

(72) Inventors: Chando Park, Irvine, CA (US); Jimmy Jianan Kan, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/241,595

(22) Filed: Aug. 19, 2016

(65) Prior Publication Data

US 2018/0040668 A1 Feb. 8, 2018

Related U.S. Application Data

(60) Provisional application No. 62/370,929, filed on Aug. 4, 2016.

(51) Int. Cl.
*H01L 27/22* (2006.01)
*H01L 43/10* (2006.01)
(Continued)

(52) U.S. Cl.
CPC .......... *H01L 27/228* (2013.01); *G11C 11/161* (2013.01); *H01L 43/02* (2013.01);
(Continued)

(58) Field of Classification Search
CPC .............................. H01L 43/02; G11C 11/161
See application file for complete search history.

(56) References Cited

U.S. PATENT DOCUMENTS 8,278,122 B2  10/2012  Lu et al.
8,772,888 B2  7/2014  Jung et al.
(Continued)

OTHER PUBLICATIONS

Kinoshita, K. et al., "Etching Magnetic Tunnel Junction with Metal Etchers," Japanese Journal of Applied Physics, vol. 49, No. 8S1, Aug. 20, 2010, 7 pages.
(Continued)

*Primary Examiner* — Moazzam Hossain
*Assistant Examiner* — Farun Lu
(74) *Attorney, Agent, or Firm* — Withrow & Terranova, PLLC

(57) ABSTRACT

Aspects disclosed include reducing or avoiding metal deposition from etching magnetic tunnel junction (MTJ) devices. In one example, a width of a bottom electrode of an MTJ device is provided to be less than a width of the MTJ stack of the MTJ device. In this manner, etching of the bottom electrode may be reduced or avoided to reduce or avoid metal redeposition as a result of over-etching the MTJ device to avoid horizontal shorts between an adjacent device(s). In another example, a seed layer is embedded in a bottom electrode of the MTJ device. In this manner, the MTJ stack is reduced in height to reduce or avoid metal redeposition as a result of over-etching the MTJ device. In another example, an MTJ device includes an embedded seed layer in a bottom electrode which also has a width less than a width of the MTJ stack.

18 Claims, 16 Drawing Sheets

(51) Int. Cl.
*H01L 43/12* (2006.01)
*H01L 43/08* (2006.01)
*H01L 43/02* (2006.01)
*G11C 11/16* (2006.01)

(52) U.S. Cl.
CPC .............. *H01L 43/08* (2013.01); *H01L 43/10* (2013.01); *H01L 43/12* (2013.01)

(56) References Cited

U.S. PATENT DOCUMENTS

| | | |
|---|---|---|
| 8,822,237 B2 | 9/2014 | Huang et al. |
| 8,975,088 B2 | 3/2015 | Satoh et al. |
| 9,142,762 B1 | 9/2015 | Li et al. |
| 9,269,893 B2 | 2/2016 | Lu et al. |
| 9,601,686 B1 * | 3/2017 | Annunziata ............. H01L 43/08 |
| 2017/0054070 A1 * | 2/2017 | Bak ......................... H01L 43/02 |
| 2017/0069684 A1 * | 3/2017 | Suh ......................... H01L 43/12 |

OTHER PUBLICATIONS

Lu, Yu et al.,"Fully Functional Perpendicular STT-MRAM Macro Embedded in 40 nm Logic for Energy-efficient IOT Applications" 2015 IEEE International Electron Devices Meeting, Dec. 5-7, 2015, IEEE, pp. 26.1.1-26.1.4.

International Search Report and Written Opinion for PCT/US2017/043021, dated Nov. 3, 2017, 12 pages.

International Preliminary Report on Patentability for PCT/US2017/043021, dated Jun. 29, 2018, 20 pages.

* cited by examiner

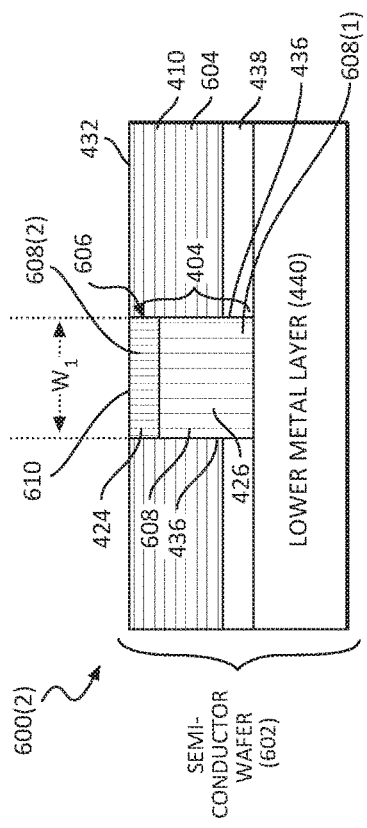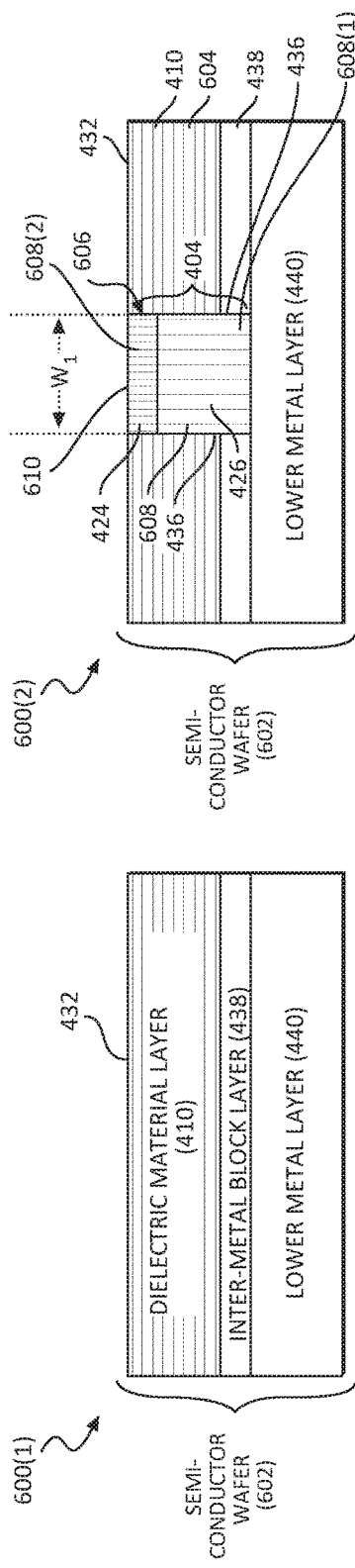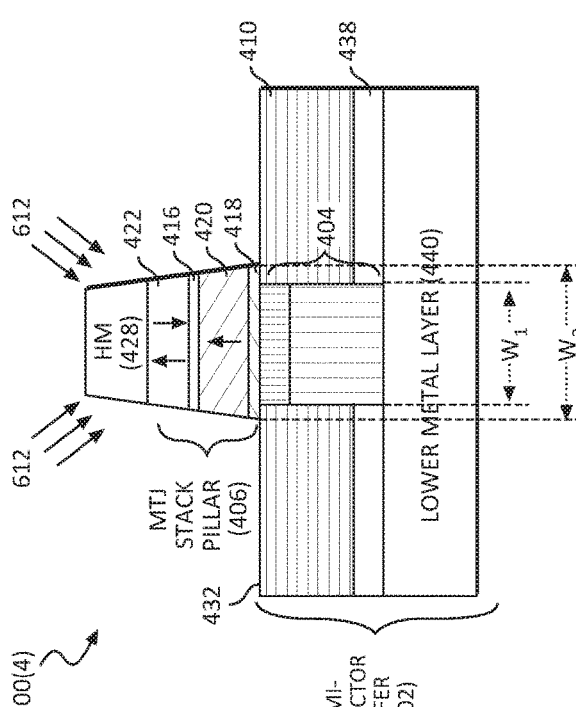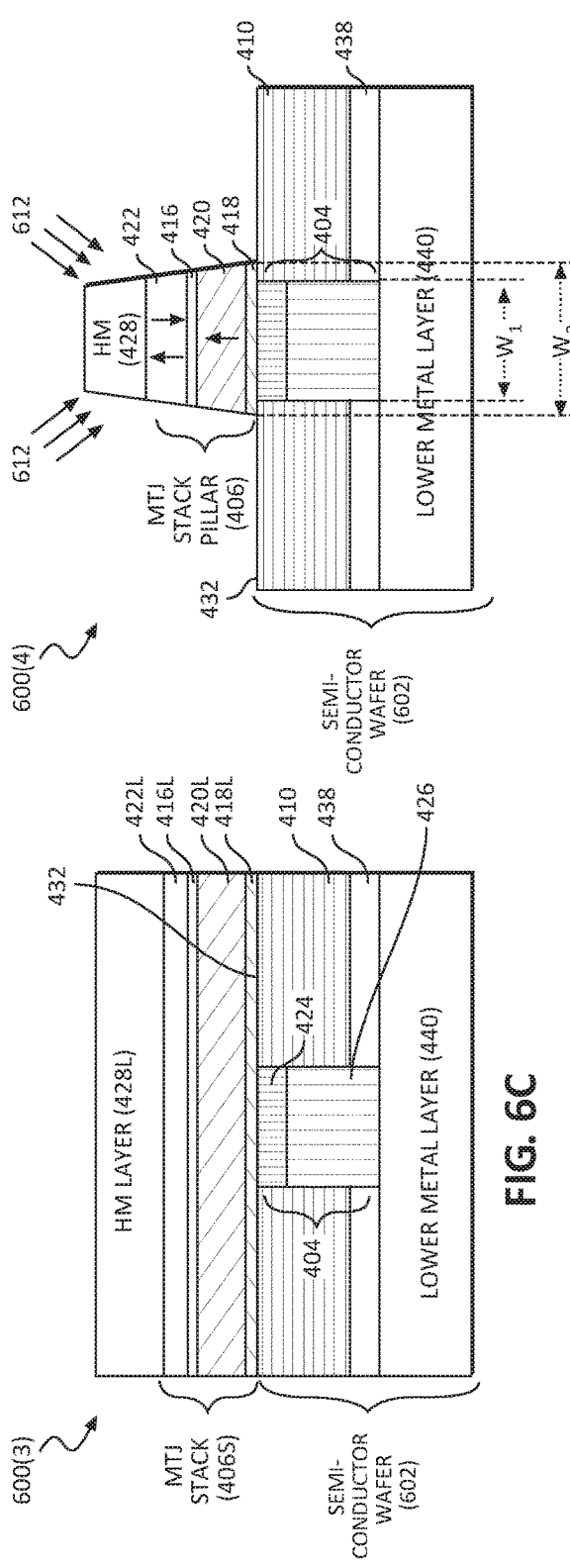

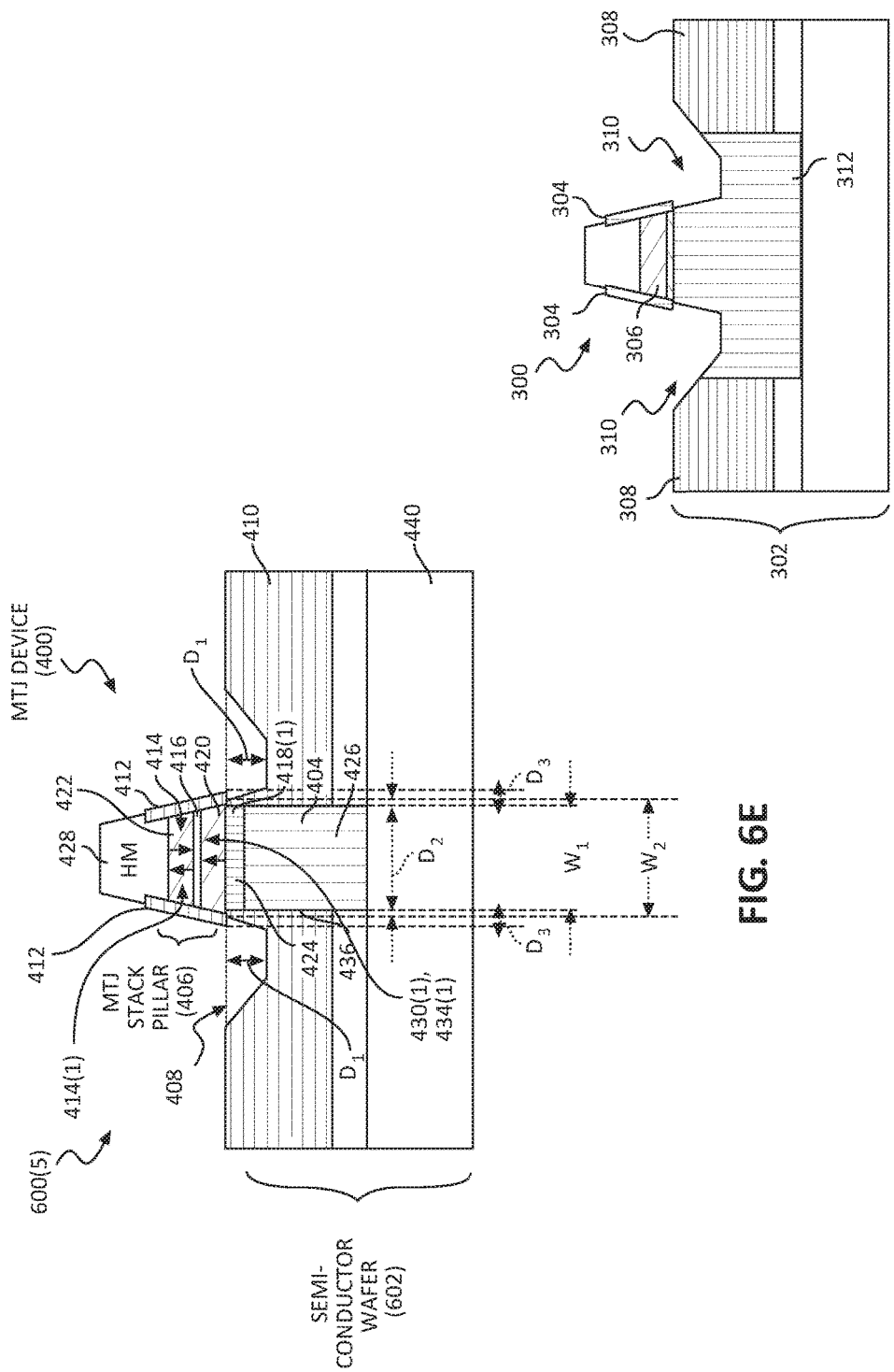

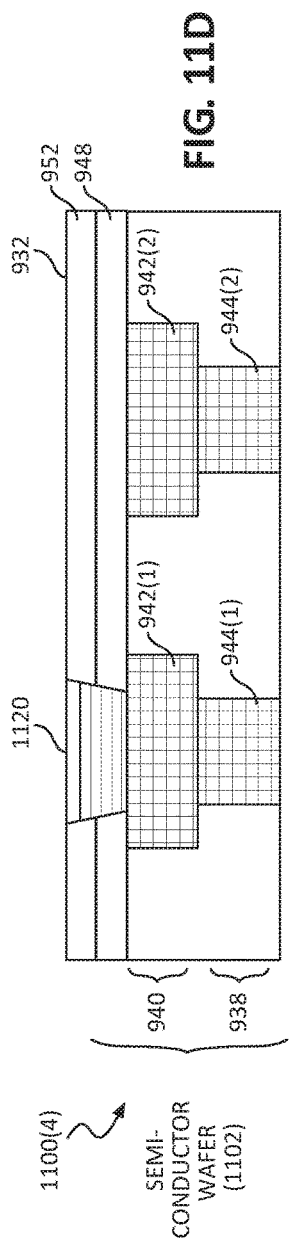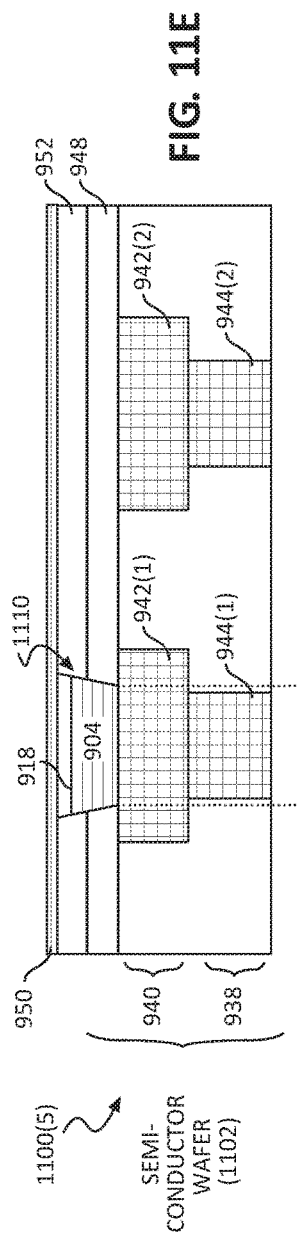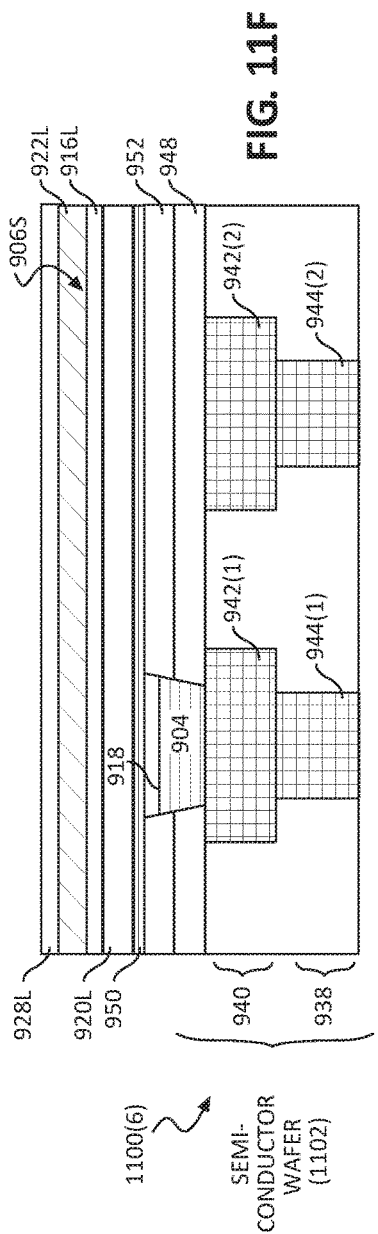

REDUCING OR AVOIDING METAL DEPOSITION FROM ETCHING MAGNETIC TUNNEL JUNCTION (MTJ) DEVICES, INCLUDING MAGNETIC RANDOM ACCESS MEMORY (MRAM) DEVICES

PRIORITY CLAIM

The present application claims priority under 35 U.S.C. § 119(e) to U.S. Provisional Patent Application Ser. No. 62/370,929 filed on Aug. 4, 2016 and entitled "REDUCING OR AVOIDING METAL DEPOSITION FROM ETCHING MAGNETIC TUNNEL JUNCTION (MTJ) DEVICES, INCLUDING MAGNETIC RANDOM ACCESS MEMORY (MRAM) DEVICES," the contents of which is incorporated herein by reference in its entirety.

BACKGROUND

I. Field of the Disclosure

The technology of the disclosure relates generally to magnetic tunnel junction (MTJ) devices, which may be employed in a resistive memory, such as a magnetic random access memory (MRAM) for example, and more particularly to fabrication of MTJ devices.

II. Background

Semiconductor storage devices are used in integrated circuits (ICs) in electronic devices to provide data storage. One example of a semiconductor storage device is magnetic random access memory (MRAM). MRAM is non-volatile memory in which data is stored by programming a magnetic tunnel junction (MTJ) as part of an MRAM bit cell. One advantage of an MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written to and stored in the MTJ by applying a magnetic field to change the orientation of the free layer to either a P or AP magnetic orientation with respect to the pinned layer.

Recent developments in MTJ devices involve spin-transfer torque (STT)-MRAM devices. In STT-MRAM devices, the spin polarization of carrier electrons, rather than a pulse of a magnetic field, is used to program the state stored in the MTJ (i.e., a '0' or a '1'). FIG. 1 below illustrates an MTJ 100. The MTJ 100 is provided as part of an MRAM bit cell 102 to store non-volatile data. A metal-oxide semiconductor (MOS) (typically N-type MOS, i.e., NMOS) access transistor 104 is provided to control reading and writing to the MTJ 100. A drain (D) of the access transistor 104 is coupled to a bottom electrode 106 of the MTJ 100, which is coupled to a pinned layer 108 for example. A word line (WL) is coupled to a gate (G) of the access transistor 104. A source (S) of the access transistor 104 is coupled to a voltage source ($V_S$) through a source line (SL). The voltage source ($V_S$) provides a voltage ($V_{SL}$) on the source line (SL). A bit line (BL) is coupled to a top electrode 110 of the MTJ 100, which is coupled to a free layer 112 for example. The pinned layer 108 and the free layer 112 are separated by a tunnel barrier 114.

With continuing reference to FIG. 1, when writing data to the MTJ 100, the gate (G) of the access transistor 104 is activated by activating the word line (WL). A voltage differential between a voltage ($V_{BL}$) on the bit line (BL) and the voltage ($V_{SL}$) on the source line (SL) is applied. As a result, a write current (I) is generated between the drain (D) and the source (S) of the access transistor 104. If the magnetic orientation of the MTJ 100 in FIG. 1 is to be changed from AP to P, a write current ($I_{AP-P}$) flowing from the free layer 112 to the pinned layer 108 is generated. This induces an STT at the free layer 112 to change the magnetic orientation of the free layer 112 to P with respect to the pinned layer 108. If the magnetic orientation is to be changed from P to AP, a current ($I_{P-AP}$) flowing from the pinned layer 108 to the free layer 112 is produced, which induces an STT at the free layer 112 to change the magnetic orientation of the free layer 112 to AP with respect to the pinned layer 108.

FIG. 2 is a schematic diagram illustrating exemplary layers of a conventional perpendicular (pMTJ) 200 provided in an MTJ stack pillar 202 that can be employed in the MTJ 100 in FIG. 1. The pMTJ 200 includes highly reliable pinned/reference layers that can be provided by high perpendicular magnetic anisotropy (PMA) materials (i.e., materials having a perpendicular magnetic easy axis). In this regard, the MTJ stack pillar 202 includes a pinned layer 204 of a high PMA material disposed on a seed layer 205 (e.g., a Tantalum (Ta)/Platinum (Pt) bilayer) above a bottom electrode 206 (e.g., made of Tantalum (Ta) Nitride (N) (TaN)) electrically coupled to the pinned layer 204. A tunnel barrier 208 provided in the form of a Magnesium Oxide (MgO) layer in this example is disposed above the pinned layer 204. The MgO tunnel barrier 208 has been shown to provide a high tunnel magnetoresistance ratio (TMR). A free layer 210, shown as a Cobalt (Co)-Iron (Fe)-Boron (B) (CoFeB) layer in this example, is disposed above the tunnel barrier 208. The CoFeB free layer 210 is a high PMA material that allows for effective current-induced magnetization switching for a low current density. A conductive, non-magnetic capping layer 212, such as a thin Magnesium Oxide (MgO) and/or Tantalum (Ta) material for example, is disposed above the free layer 210 to protect the layers of the MTJ stack pillar 202. A top electrode 214 is disposed above the capping layer 212 to provide an electrical coupling to the free layer 210.

In the MTJ stack pillar 202 in FIG. 2, the magnetic orientation of the pinned layer 204 is fixed. Accordingly, the pinned layer 204 generates a constant magnetic field, also known as a "net stray dipolar field," that may affect, or "bias," a magnetic orientation of the free layer 210. This magnetic field bias, at best, can cause an asymmetry in the magnitude of current necessary to change the magnetic orientation of the free layer 210 (i.e., $I_{P-AP}$ is different than $I_{AP-P}$). The current necessary to change the magnetic orientation of the free layer 210 towards the bias orientation is reduced while the current necessary to change the magnetic orientation of the free layer 210 against the bias is increased. At worst, this magnetic field bias can be strong enough to "flip" the value of a memory bit cell employing the pMTJ 200 in FIG. 2, thus decreasing the reliability of the subject MRAM. To reduce or prevent a magnetic field bias being provided by the pinned layer 204 on the free layer 210, the pinned layer 204 in the MTJ stack pillar 202 in FIG. 2 includes a synthetic anti-ferromagnetic (SAF) structure 216. The SAF structure 216 includes a hard, first anti-parallel ferromagnetic (AP1) layer and a second anti-parallel ferromagnetic (AP2) layer separated by a non-magnetic anti-ferromagnetic coupling (AFC) layer 218 (e.g., a Ruthenium (Ru) layer). The AP1 and AP2 layers are permanently magnetized and magnetically coupled in opposite orientations to generate opposing magnetic fields. The opposing magnetic fields produce a zero or near-zero net magnetic field towards the free layer 210, thus reducing the magnetic field bias problem at the free layer 210.

MTJ patterning or etching processes are used to fabricate MTJs, such as the MTJ stack pillar 202 in FIG. 2. MTJ etching involves the need to etch complicated metal stacks. Currently known methods for MTJ etching, especially at tight pitches, include ion beam etching (IBE) and chemical etching in a reactive ion etching (RIE), both of which have challenges. RIE processes are known to create damage zones around the perimeter of the MTJ. Etching damage in the transition metals (i.e., the pinned layer 204, the free layer 210, and the bottom and top electrodes 206, 214) in the MTJ can affect factors such as a tunnel magnetoresistance ratio (TMR) and energy barrier (Eb) variations, which can result in poor MTJ performance. Another method of MTJ etching involves IBE. IBE may be used for etching materials that have tendencies to not react well to chemical etching. An IBE process can avoid or reduce damage zones over RIE processes, but no chemical component is involved to improve etching selectivity. IBE involves directing a charged particle ion beam at a target material to etch the material.

With both RIE and IBE processes, etched metal can be redeposited at a tunnel barrier of an etched MTJ stack pillar. For example, FIG. 3 illustrates exemplary MTJ devices 300(1), 300(2) similar to the MTJ stack pillar 202 in FIG. 2 fabricated in a semiconductor wafer 302 that have metal redeposition 304(1), 304(2) around an MTJ stack pillar 306(1), 306(2) as a result of etching MTJ stacks and over-etching at the end of an MTJ device etch process. Areas in a dielectric material layer 308 adjacent to the MTJ stack pillars 306(1), 306(2) are over-etched to form over-etch trenches 310(1), 310(2) to avoid horizontal shorts between adjacent devices at smaller pitches. However, bottom electrodes 312(1), 312(2) of the MTJ devices 300(1), 300(2) are also etched as a result of this over-etching. Metal etched from the bottom electrodes 312(1), 312(2) is redeposited as the metal redeposition 304(1), 304(2) around an MTJ stack pillar 306(1), 306(2). Even tiny amounts of redeposited metal material can cause metal shorts across a tunnel barrier of the MTJ stack pillar 306(1), 306(2), because the tunnel barrier in the MTJ stack pillar 306(1), 306(2) may be as small as one (1) nanometer (nm) in height. This metal redeposition 304(1), 304(2) can lead to metal shorts. Thus, as MTJ devices become scaled down, such as in high-density MRAMs, this redeposition from over-etching can limit the amount of downscaling.

SUMMARY OF THE DISCLOSURE

Aspects of the present disclosure involve reducing or avoiding metal deposition from etching of magnetic tunnel junction (MTJ) devices. For example, such MTJ devices may be employed to provide resistive memory bit cells for magnetic random access memory (MRAM). In one exemplary aspect disclosed herein, a width of a bottom electrode of an MTJ device is provided to be less than a width of the MTJ stack pillar in the MTJ device. In this manner, when the MTJ device is over-etched to avoid horizontal shorts between an adjacent device(s), etching of the bottom electrode is reduced or avoided to reduce or avoid metal redeposition on the MTJ stack pillar of the MTJ device. In another exemplary aspect disclosed herein, a metal seed layer for providing a textured conductive coupling of an MTJ stack pillar of the MTJ device to a bottom electrode of the MTJ device is embedded in the bottom electrode. In this manner, the MTJ stack pillar is reduced in height to reduce metal material in the MTJ stack pillar that can be redeposited on a sidewall of the MTJ device during etching. In another exemplary aspect disclosed herein, an MTJ device can be provided that includes an embedded seed layer in a bottom electrode which also has a width less than the width of the MTJ stack pillar in the MTJ device. In this manner, when the MTJ device is etched to form the MTJ stack pillar, etching of the metal material is reduced that can reduce or avoid metal redeposition on the MTJ stack pillar of the MTJ device. Further, an over-etching of the MTJ device to avoid horizontal shorts between an adjacent device(s) may not have to extend as deep or etch as much of the bottom electrode to avoid metal redeposition on the MTJ stack pillar of the MTJ device from over-etching of the bottom electrode.

In this regard, in one exemplary aspect, an MTJ device is provided. The MTJ device comprises a bottom electrode having a width. The MTJ device also comprises a seed layer. The MTJ device also comprises an MTJ stack pillar having a width larger than the width of the bottom electrode and disposed above and in electrical contact with the bottom electrode. The MTJ stack pillar comprises a pinned layer disposed above the seed layer, a free layer disposed above the seed layer, and a tunnel barrier disposed between the pinned layer and the free layer. The tunnel barrier is configured to provide a tunnel magnetoresistance between the pinned layer and the free layer.

In another exemplary aspect, a method of fabricating an MTJ device is provided. The method comprises disposing a dielectric material layer above a lower metal layer in a semiconductor wafer, the dielectric material layer comprising a top surface. The method also comprises removing a portion of dielectric material of the dielectric material layer to form an opening having an opening width. The method also comprises disposing one or more metal materials in the opening to form a bottom electrode having a width of the opening width. The method also comprises disposing an MTJ stack having a width larger than the opening width above and in electrical contact with the bottom electrode. The MTJ stack comprises a pinned layer disposed above a seed layer, a free layer disposed above the seed layer, and a tunnel barrier disposed between the pinned layer and the free layer. The tunnel barrier is configured to provide a tunnel magnetoresistance between the pinned layer and the free layer. The method also comprises removing material from the MTJ stack to form an MTJ stack pillar having a width larger than the width of the bottom electrode.

In another exemplary aspect, an MTJ device is provided. The MTJ device comprises a dielectric material layer comprising a top surface. The MTJ device also comprises a bottom electrode disposed in an opening in the dielectric material layer, the bottom electrode comprising a top surface disposed below the top surface of the dielectric material layer. The MTJ device also comprises an embedded seed layer disposed in the opening in the dielectric material layer in contact with the top surface of the bottom electrode. The MTJ device also comprises an MTJ stack pillar disposed above the dielectric material layer and in electrical contact with embedded the seed layer. The MTJ stack pillar comprises a pinned layer, a free layer, and a tunnel barrier disposed between the pinned layer and the free layer. The tunnel barrier is configured to provide a tunnel magnetoresistance between the pinned layer and the free layer.

In another exemplary aspect, a method of fabricating an MTJ device is provided. The method comprises disposing a dielectric material layer above a lower metal layer in a semiconductor wafer, the dielectric material layer comprising a top surface. The method also comprises removing a portion of dielectric material of the dielectric material layer to form an opening having an opening width. The method also comprises disposing one or more metal materials in the opening below the top surface of the dielectric material layer to form a bottom electrode having a width of the opening width. The method also comprises embedding a seed layer material in the opening in the dielectric material layer in contact with the top surface of the bottom electrode. The MTJ device also comprises removing a portion of the seed layer material to be substantially planar with the top surface of the dielectric material layer. The method also comprises disposing an MTJ stack above the dielectric material layer and in electrical contact with a remaining portion of the seed layer material. The MTJ stack comprises a pinned layer, a free layer, and a tunnel barrier disposed between the pinned layer and the free layer. The tunnel barrier is configured to provide a tunnel magnetoresistance between the pinned layer and the free layer. The method also comprises removing material from the MTJ stack to form an MTJ stack pillar.

BRIEF DESCRIPTION OF THE FIGURES

FIGS. 6A-6E illustrate exemplary process stages during fabrication of an MTJ device in a semiconductor wafer according to the exemplary process in FIG. 5, wherein a width of a bottom electrode is less than a width of an MTJ stack pillar to reduce an amount of metal material that can be over-etched to reduce or avoid metal redeposition;

FIG. 7 is a schematic diagram of an exemplary conventional MTJ device that has been over-etched with metal material from a bottom electrode redeposited on an MTJ stack pillar forming a short across a tunnel barrier;

FIGS. 11A-11G illustrate exemplary process stages during fabrication of an MTJ device in a semiconductor wafer according to the exemplary process in FIG. 10;

DETAILED DESCRIPTION

Figure 1:
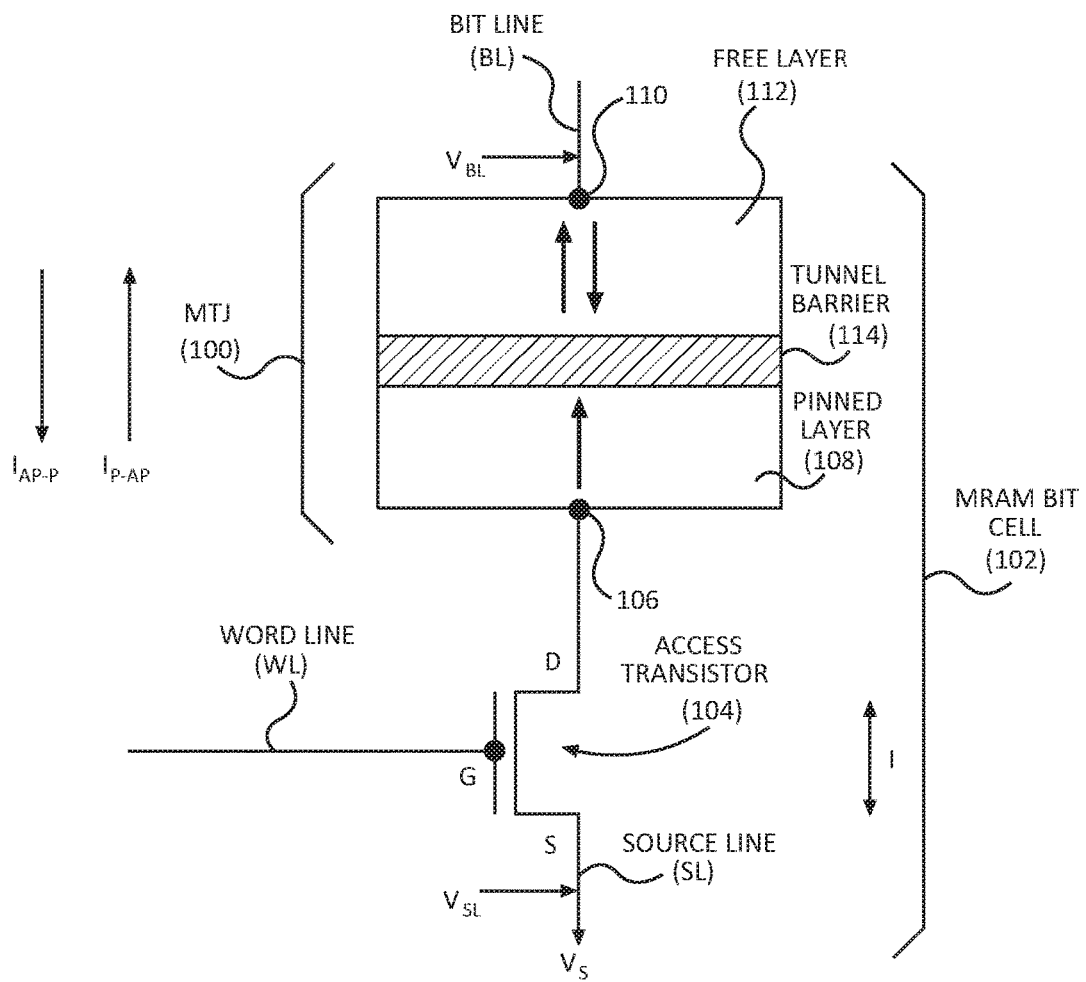
FIG. 1 is an exemplary magnetic tunnel junction (MTJ) provided in a magnetic random access memory (MRAM) bit cell to store data as a function of magnetization directions of a pinned layer and a free layer in the MTJ.
Figure 2:
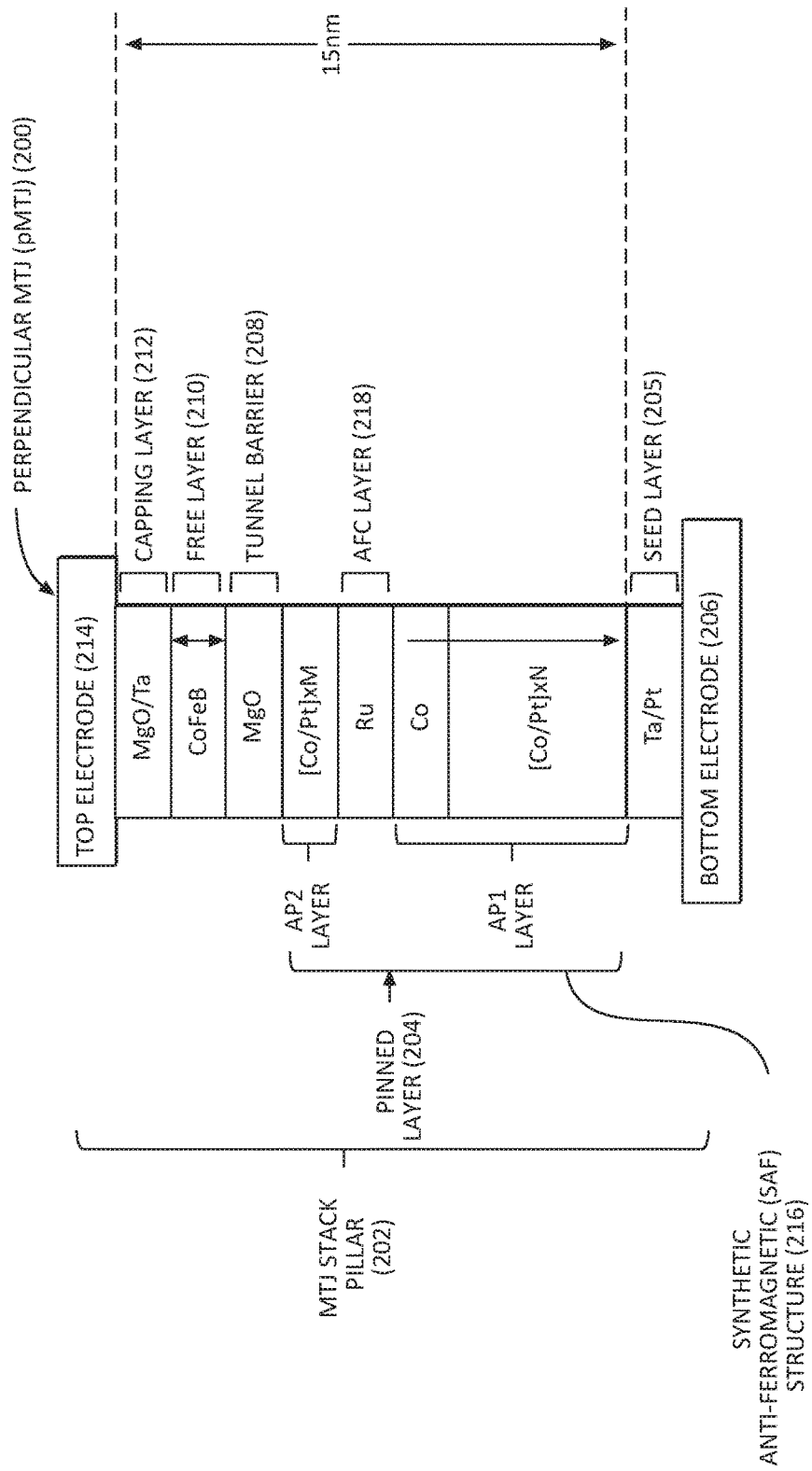
FIG. 2 is a schematic diagram illustrating a conventional perpendicular MTJ (pMTJ) and exemplary conventional layers provided therein.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure involve reducing or avoiding metal deposition from etching of magnetic tunnel junction (MTJ) devices. For example, such MTJ devices may be employed to provide resistive memory bit cells for magnetic random access memory (MRAM). In one exemplary aspect disclosed herein, a width of a bottom electrode of an MTJ device is provided to be less than a width of the MTJ stack pillar in the MTJ device. In this manner, when the MTJ device is over-etched to avoid horizontal shorts between an adjacent device(s), etching of the bottom electrode is reduced or avoided to reduce or avoid metal redeposition on the MTJ stack pillar of the MTJ device. In another exemplary aspect disclosed herein, a metal seed layer for providing a textured conductive coupling of an MTJ stack pillar of the MTJ device to a bottom electrode of the MTJ device is embedded in the bottom electrode. In this manner, the MTJ stack pillar is reduced in height to reduce metal material in the MTJ stack pillar that can be redeposited on a sidewall of the MTJ device during etching. In another exemplary aspect disclosed herein, an MTJ device can be provided that includes an embedded seed layer in a bottom electrode which also has a width less than the width of the MTJ stack pillar in the MTJ device. In this manner, when the MTJ device is etched to form the MTJ stack pillar, etching of the metal material is reduced that can reduce or avoid metal redeposition on the MTJ stack pillar of the MTJ device. Further, an over-etching of the MTJ device to avoid horizontal shorts between an adjacent device(s) may not have to extend as deep or etch as much of the bottom electrode to avoid metal redeposition on the MTJ stack pillar of the MTJ device from over-etching of the bottom electrode.

Figure 4:
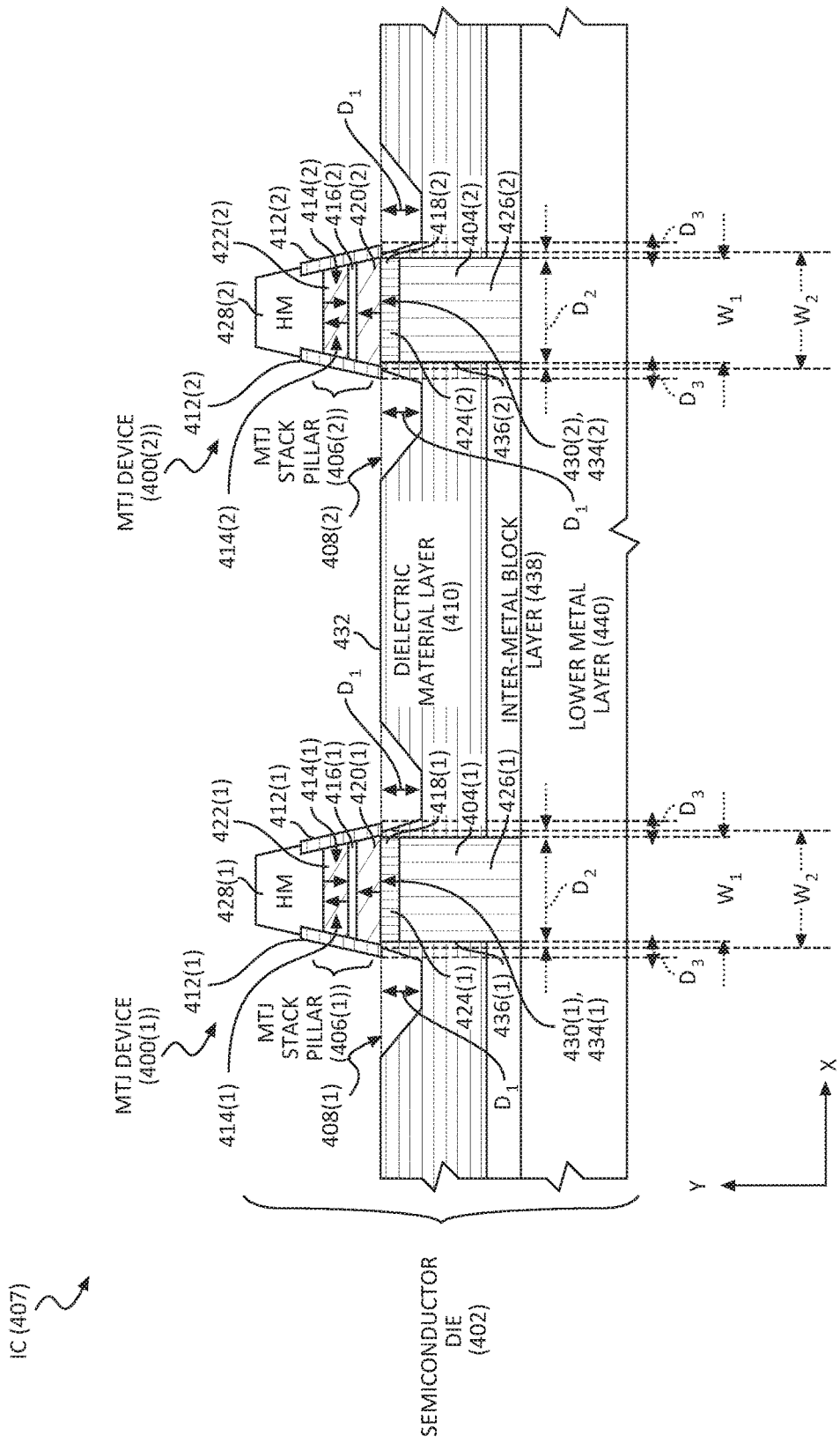
FIG. 4 is a schematic diagram of exemplary MTJ devices in a semiconductor die wherein a width of a bottom electrode of the MTJ devices is less than a width of their MTJ stack pillar, to reduce an amount of metal material that can be over-etched to reduce or avoid metal redeposition.

In this regard, FIG. 4 is a schematic diagram of exemplary MTJ devices 400(1), 400(2) in a semiconductor die 402 wherein widths $W_1$ of bottom electrodes 404(1), 404(2) of the MTJ devices 400(1), 400(2) is less than widths $W_2$ of their respective MTJ stack pillars 406(1), 406(2). The semiconductor die 402 can be provided in an integrated circuit (IC) 407. The bottom electrodes 404(1), 404(2) are formed from one or more metal materials, such as Copper (Cu), Tungsten (W), Tantalum (Ta), or Tantalum (Ta) Nitride (N) (TaN) materials, as examples. As will be discussed in more detail below, when the MTJ devices 400(1), 400(2) are over-etched to form over-etch trenches 408(1), 408(2) adjacent to the MTJ stack pillars 406(1), 406(2) as shown in FIG. 4, to avoid horizontal shorts between adjacent devices for example, etching of the bottom electrodes 404(1), 404(2) is reduced or avoided. A dielectric material layer 410 adjacent to the bottom electrodes 404(1), 404(2) and the MTJ stack pillars 406(1), 406(2) is etched during over-etching. Thus, redeposited dielectric materials 412(1), 412(2) are a result of etching the dielectric material layer 410, including during an over-etching process, and may be deposited on side walls 414(1), 414(2) of the MTJ stack pillars 406(1), 406(2) as shown in FIG. 4. However, the redeposited dielectric material 412(1), 412(2) does not cause metal shorts across the layers in the MTJ stack pillars 406(1), 406(2), including across their respective tunnel barriers 416(1), 416(2). Thus, by providing the bottom electrodes 404(1), 404(2) of the MTJ devices 400(1), 400(2) to be a width $W_1$ less than the width $W_2$ of the MTJ stack pillars 406(1), 406(2), the etching of metal material that can be redeposited around the MTJ stack pillars 406(1), 406(2), including during an over-etching process, is reduced or avoided.

With continuing reference to FIG. 4, the MTJ stack pillars 406(1), 406(2) were formed from etching or other removal of materials from an MTJ stack (not shown) of material layers. The MTJ stack pillars 406(1), 406(2) in FIG. 4 include seed layers 418(1), 418(2) disposed above an electrical contact with the respective bottom electrodes 404(1), 404(2). For example, the seed layers 418(1), 418(2) may be thick layers that are between five (5) and ten (10) nanometers (nm) in thickness. In this example, pinned magnetization layers ("pinned layers") 420(1), 420(2) are disposed above and in electrical contact with the seed layers 418(1), 418(2). The seed layers 418(1), 418(2) provide textured surfaces to promote smooth and epitaxial crystal growth of the pinned layers 420(1), 420(2) in a specific desired orientation to provide desired magnetic properties. The seed layers 418(1), 418(2) can also be processed into smooth surfaces to reduce the roughness of the interface of the bottom electrodes 404(1), 404(2), that could otherwise cause uneven growth imperfections or variations in the pinned layers 420(1), 420(2) due to uneven deposition. These imperfections could propagate through the MTJ stack pillars 406(1), 406(2), thus creating "rough" surfaces at a base of the tunnel barriers 416(1), 416(2) and reducing a tunnel magnetoresistance ratio (TMR). The material chosen for the seed layers 418(1), 418(2) will depend on the materials chosen for the pinned layers 420(1), 420(2). For example, the seed layers 418(1), 418(2) could be selected from metal materials, such as Platinum (Pt), Tantalum (Ta), or Ruthenium (Ru), or alloys such as Ta Nitride (TaN). The tunnel barriers 416(1), 416(2) are disposed above the pinned layers 420(1), 420(2). Free magnetization layers ("free layers") 422(1), 422(2) are disposed above the tunnel barriers 416(1), 416(2).

With continuing reference to FIG. 4, the widths $W_1$ of the bottom electrodes 404(1), 404(2) may be deemed a largest cross-section width of the bottom electrodes 404(1), 404(2) if the bottom electrodes 404(1), 404(2) do not have a straight vertical profile in the Y direction. For example, the widths $W_1$ of the bottom electrodes 404(1), 404(2) may be between fifteen (15) and fifty (50) nanometers (nm) as non-limiting examples. Further, the bottom electrodes 404(1), 404(2) may be made from two or more metal materials, such as first metal materials 424(1), 424(2), such as Tungsten (W), and second metal materials 426(1), 426(2) such as a Tantalum Nitride (TaN) material disposed above the first metal materials 424(1), 424(2). Further, the widths $W_2$ of the MTJ stack pillars 406(1), 406(2) labeled in FIG. 4 are the largest cross-section widths of the MTJ stack pillars 406(1), 406(2) since the MTJ stack pillars 406(1), 406(2) do not have a completely vertical profile as a result of etching in this example. For example, the widths $W_2$ of the MTJ stack pillars 406(1), 406(2) may be between twenty (20) and sixty (60) nanometers (nm) as non-limiting examples. Hard masks (HM) 428(1), 428(2) disposed above the MTJ stack pillars 406(1), 406(2) control the shape of the etched and formed MTJ stack pillars 406(1), 406(2), and thus may control the distances and locations of the over-etch trenches 408(1), 408(2) formed in the dielectric material layer 410.

With continuing reference to FIG. 4, the over-etch trenches 408(1), 408(2) may extend a depth $D_1$ below bottom surfaces 430(1), 430(2) of the MTJ stack pillars 406(1), 406(2) or a top surface 432 of the dielectric material layer 410. For example, the bottom surfaces 430(1), 430(2) of the MTJ stack pillars 406(1), 406(2) may be bottom surfaces of the seed layers 418(1), 418(2) at the interface between the seed layers 418(1), 418(2) and top surfaces 434(1), 434(2) of the bottom electrodes 404(1), 404(2). For example, this depth $D_1$ may be between approximately five (5) and twenty (20) nanometers (nm). Note that the over-etch trenches 408(1), 408(2) in this example do not extend into the bottom electrodes 404(1), 404(2), because the bottom electrodes 404(1), 404(2) are reduced in the horizontal direction X due to their reduced widths $W_1$, as discussed above. The over-etch trenches 408(1), 408(2) are disposed a minimum distance $D_2$ from outer surfaces 436(1), 436(2) of the bottom electrodes 404(1), 404(2). A distance between the over-etch trenches 408(1), 408(2) and the outer surfaces 436(1), 436(2) of the bottom electrodes 404(1), 404(2) may vary between the minimum distance $D_2$ and a maximum distance $D_3$ if the etch profile of the over-etch trenches 408(1), 408(2) is not straight in the vertical Y direction, as shown in FIG. 4. As an example, minimum distance $D_2$ between the over-etch trenches 408(1), 408(2) and the outer surfaces 436(1), 436(2) of the bottom electrodes 404(1), 404(2) may be at least two (2) nanometers (nm). As an example, maximum distance $D_3$ between the over-etch trenches 408(1), 408(2) and the outer surfaces 434(1), 434(2) of the bottom electrodes 404(1), 404(2) may be at least fifty (50) nanometers (nm). The over-etch trenches 408(1), 408(2) may also extend below the dielectric material layer 410 into an inter-metal block layer 438 and/or a lower metal layer 440 (e.g., a metal 2 (M2) or metal 3 (M3) layer) in which the dielectric material layer 410 is disposed above in the semiconductor die 402.

Figure 5:
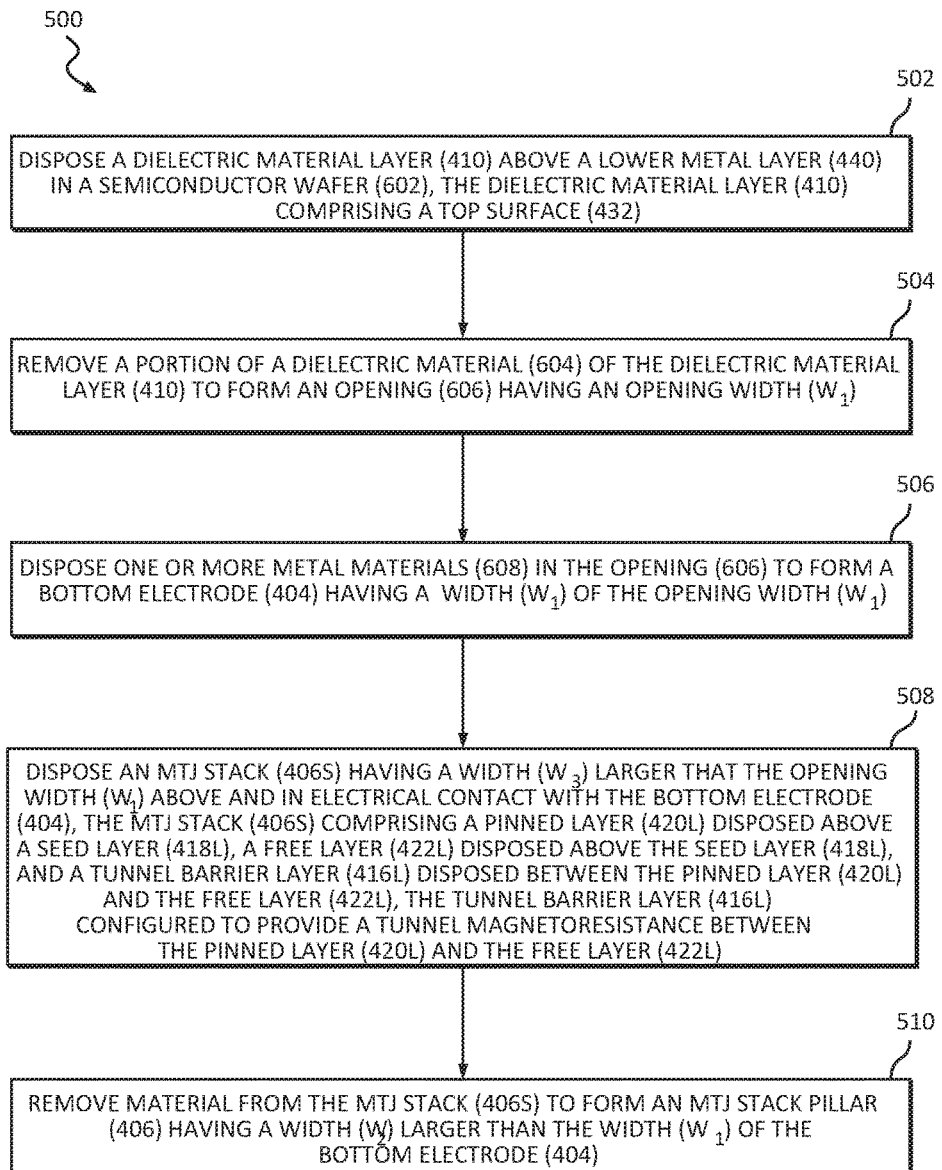
FIG. 5 is a flowchart illustrating an exemplary process of fabricating the MTJ devices in FIG. 4, including etching of an MTJ stack to form an MTJ stack pillar and over-etching the MTJ devices to avoid horizontal shorts between an adjacent device.

To further discuss fabrication of an MTJ device that has an MTJ stack pillar having a larger width than the width of its bottom electrode, such as the MTJ devices 400(1), 400(2) in FIG. 4, FIGS. 5-6E are provided. FIG. 5 is a flowchart illustrating an exemplary process 500 of fabricating an MTJ device, such as the MTJ devices 400(1), 400(2) in FIG. 4. FIGS. 6A-6E illustrate exemplary process stages 600(1)-600(5) during the fabrication of an MTJ device 400 in a semiconductor wafer 602 according to the exemplary process 500 in FIG. 5. The details discussed above with regard to the exemplary MTJ devices 400(1), 400(2) in FIG. 4 are also applicable to the MTJ device 400 fabricated in the process stages 600(1)-600(5) in FIGS. 6A-6E, and thus will not be repeated. Common elements between the MTJ devices 400(1), 400(2) in FIG. 4 and elements shown in the process stages 600(1)-600(5) in FIGS. 6A-6E are shown with common element numbers.

In this regard, FIG. 6A illustrates a first exemplary process stage 600(1) of fabricating an MTJ device that will have a final MTJ stack pillar with a larger width than a width of the bottom electrode. As shown in FIG. 6A, the dielectric material layer 410 is disposed above the lower metal layer 440 in a semiconductor wafer 602 (block 502 in FIG. 5). The dielectric material layer 410 may be disposed on an inter-metal block layer 438 that is disposed on the lower metal layer 440. A top surface 432 will be formed on the dielectric material layer 410.

Further, as shown in an exemplary process stage 600(2) in FIG. 6B, a bottom electrode 404 is formed in the dielectric material layer 410 such that a dielectric material 604 from the dielectric material layer 410 is adjacent to an outer surface 436 of the bottom electrode 404. For example, a portion of the dielectric material 604 of the dielectric material layer 410 forms an opening 606 having an opening width $W_1$ (block 504 in FIG. 5). Thereafter, one or more metal materials 608, which are the first and second metal materials 424, 426 in this example, are disposed in the opening 606 to form the bottom electrode 404 also having the opening width $W_1$ (block 506 in FIG. 5). If it is desired to provide more than one metal material 608 in the opening 606, a first metal material 608(1) may be disposed in the opening 606 as shown in FIG. 6B, followed by a recessing of the first metal material 608(1) below the top surface 432 of the dielectric material layer 410. Then, a second metal material 608(2) may be disposed in the opening 606 above and in contact with the first metal material 608(1) to form the bottom electrode 404.

Note that the opening 606 in the process stage 600(2) in FIG. 6B extends through the inter-metal block layer 438, because the bottom electrode 404 will be electrically connected to another device in the semiconductor wafer 602 through the lower metal layer 440 in this example. Further, note that a top surface 610 of the bottom electrode 404 could be further processed, such as through a CMP process, to provide a smooth top surface 610 that is substantially planar to the top surface 432 of the dielectric material layer 410.

Next, as shown in an exemplary process stage 600(3) in FIG. 6C, an MTJ stack 406S of a width larger than the opening width $W_1$ is disposed above and in electrical contact with the bottom electrode 404 (block 508 in FIG. 5). The MTJ stack 406S comprises a plurality of layers that have not yet been further processed, such as etched, to form MTJ stack pillars for MTJ devices. The MTJ stack 406S comprises a pinned layer 420L disposed above a seed layer 418L, a free layer 422L disposed above the seed layer 418L, and a tunnel barrier layer 416L disposed between the pinned layer 420L and the free layer 422L. The tunnel barrier layer 416L is configured to provide a tunnel magnetoresistance between the pinned layer 420L and the free layer 422L. After the MTJ stack 406S is disposed on the dielectric material layer 410 on contact with the bottom electrode 404, the MTJ stack 406S may be annealed as an example to provide the desired electrical properties in the MTJ stack 406S. A hard mask layer 428L may then be disposed on the MTJ stack 406S to protect portions of the MTJ stack 406S during etching, such as IBE, to form an MTJ stack pillar, as shown in a process stage 600(4) in FIG. 6D.

Note that in this example, the pinned layer 420L of the MTJ stack 406S as shown in FIG. 6C is disposed directly above the seed layer 418L and below the tunnel barrier layer 416L, and the free layer 422L is disposed above the tunnel barrier layer 416L. However, note that in the alternative, the pinned layer 420L could be disposed above the tunnel barrier layer 416L, with the free layer 422L disposed below the tunnel barrier layer 416L.

As shown in the exemplary process stage 600(4) in FIG. 6D, material is removed from the MTJ stack 406S to form the MTJ stack pillar 406 having a width $W_2$ larger than the width $W_1$ of the bottom electrode 404 (block 510 in FIG. 5). For example, a lithography process may be used to form openings in the hard mask layer 428L to then remove portions of the hard mask layer 428L to leave a remaining hard mask 428 above the location where the MTJ stack pillar 406 is to be formed. Then, as an example, an ion beam 612 may be directed toward the MTJ stack 406S to form the MTJ stack pillar 406, as shown in FIG. 6D to form the MTJ device 400. The hard mask 428 protects the MTJ stack 406S to be etched at the desired width characteristics. Then, as shown in an exemplary process stage 600(5) in FIG. 6E, an over-etching process may be employed to form the over-etch trenches 408 to avoid or reduce horizontal metal shorts between adjacent devices as previously described and shown in FIG. 4.

Figure 3:
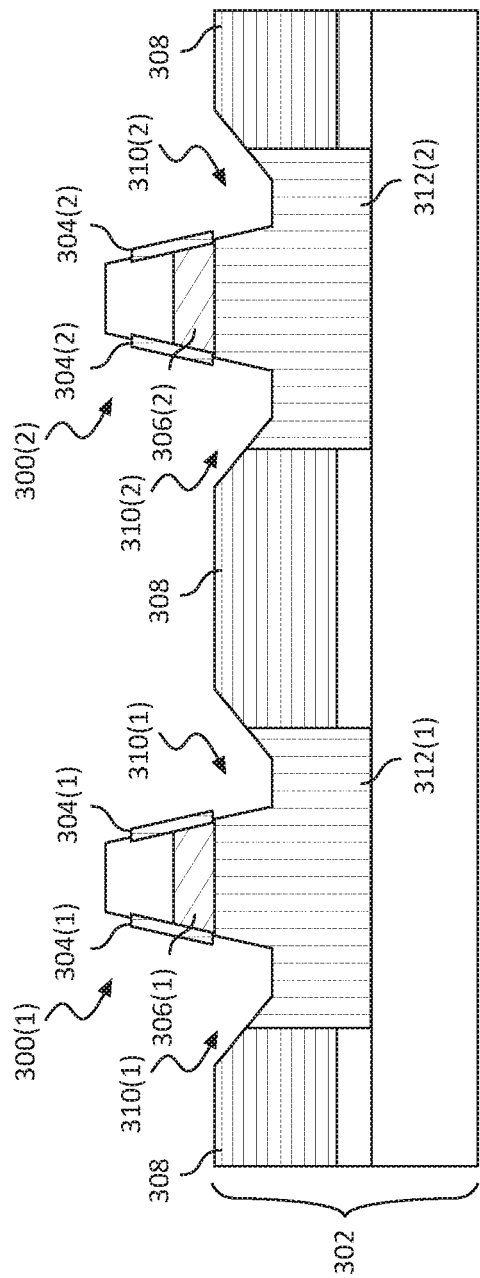
FIG. 3 illustrates a conventional MTJ device in a semiconductor wafer that has metal redeposition as a result of over-etching.
Figure 8:
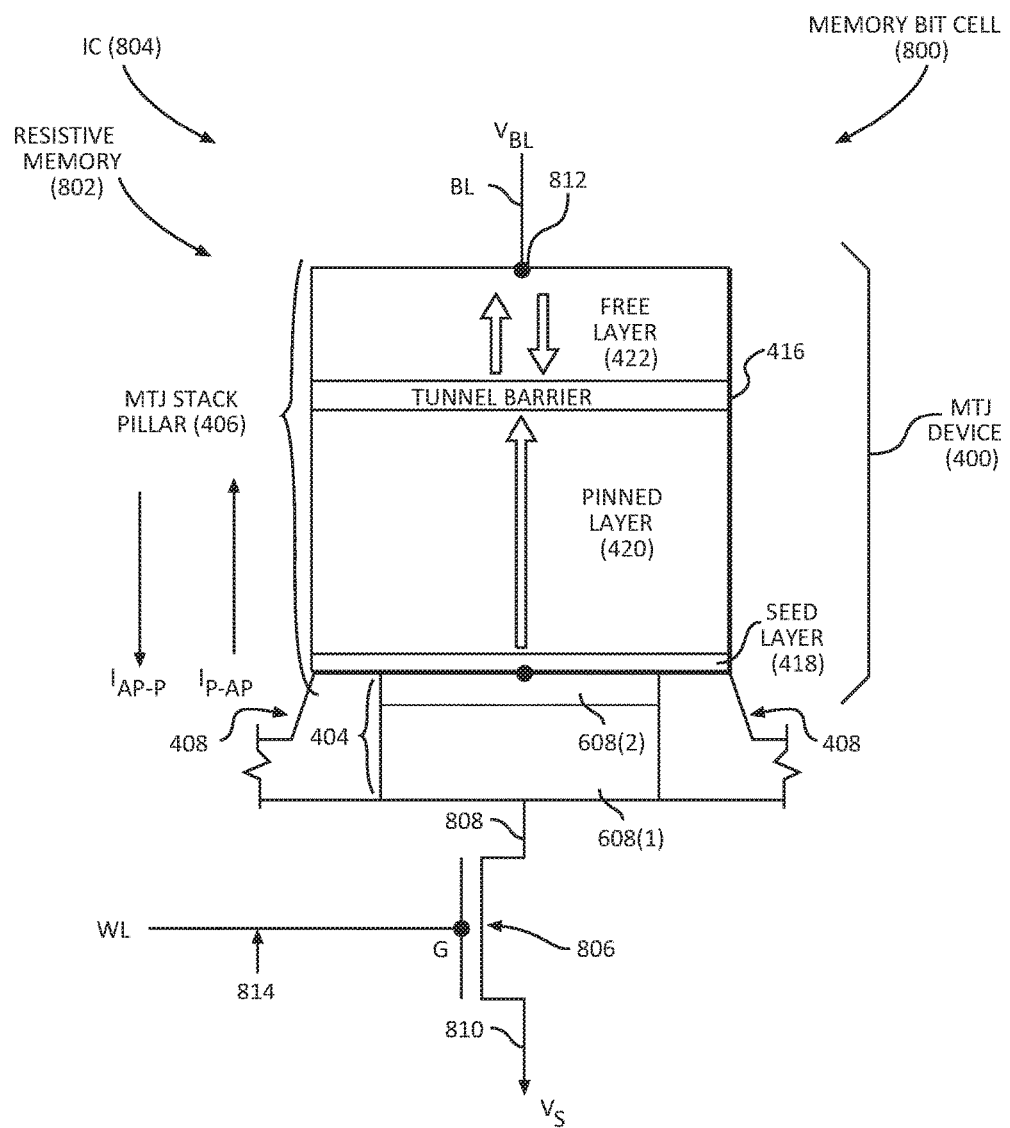
FIG. 8 is a schematic diagram of an MRAM bit cell employing an MTJ device wherein a width of a bottom electrode is less than a width of an MTJ stack pillar to reduce an amount of metal material that can be over-etched to reduce or avoid metal redeposition.

Compare the MTJ device 400 in FIG. 6E to the MTJ device 300 in FIG. 7, which is the MTJ device 300 previously discussed above with reference to FIG. 3. Note that the bottom electrode 312 of the MTJ device 300 has been etched during the over-etching process resulting in metal redeposition 304 around an MTJ stack pillar 306. This metal redeposition 304 risks metal shorts in the MTJ stack pillar 306. Further processing steps may be required to clean and remove this metal redeposition 304 to avoid metal shorts. In the MTJ device 400 in FIG. 6E, the width $W_1$ of the bottom electrodes 404 is less than the width $W_2$ of the MTJ stack pillar 406. Thus, when the MTJ device 400 is over-etched to form the over-etch trench 408 adjacent to the MTJ stack pillar 406 to avoid horizontal shorts between adjacent devices for example, etching of the bottom electrode 404 is reduced or avoided. The redeposited dielectric material 412 are a result of etching the dielectric material layer 410, including during an over-etching process, and may be deposited on the side walls 414(1), 414(2) of the MTJ stack pillars 406(1), 406(2) as shown in FIG. 4. However, the redeposited dielectric material 412(1), 412(2) does not causes metal shorts across the layers in the MTJ stack pillars 406(1), 406(2), including across their respective tunnel barriers 416(1), 416(2). Thus, by providing the bottom electrodes 404(1), 404(2) of the MTJ devices 400(1), 400(2) to be a width $W_1$ less than the width $W_2$ of the MTJ stack pillars 406(1), 406(2), the etching of metal material that can be redeposited around the MTJ stack pillars 406(1), 406(2), including during an over-etching process, is reduced or avoided FIG. 8 is a schematic diagram of a memory bit cell 800 employing the MTJ device 400 in FIG. 6D as a storage element when used in a resistive memory 802, such as an MRAM, for example. The resistive memory 802 may be included in an IC 804. As shown in FIG. 8, the memory bit cell 800 includes an access transistor 806 for controlling read and write operations to the MTJ device 400 acting as a storage element. The access transistor 806 is provided in the form of an NMOS transistor in this example, that includes a gate (G) coupled to a word line (WL), a first electrode 808 (e.g., a drain), and a second electrode 810 (e.g., a source). The bottom electrode 404 of the MTJ device 400 is coupled to the first electrode 808 of the access transistor 806. A top electrode 812 is electrically coupled to the free layer 422 of the MTJ device 400 and to a bit line (BL) to couple the MTJ device 400 to the bit line (BL). When accessing the MTJ device 400, the MTJ device 400 is configured to receive a current $I_{AP-P}$ or $I_{P-AP}$ flowing between the top and bottom electrodes 812, 404 as a result of the voltage differential between a voltage ($V_{BL}$) coupled to the bit line (BL) and a voltage ($V_S$) coupled to the bottom electrode 404 when a signal 814 on the word line (WL) activates the access transistor 806 to couple the voltage ($V_S$) coupled to the bottom electrode 404. The amount of current $I_{AP-P}$ or $I_{P-AP}$ is controlled by voltage ($V_{BL}$) and voltage ($V_S$) and whether the operation is a read or write operation. Write operations take more current to change the magnetization state of the free layer 422. The direction of the current $I_{AP-P}$ or $I_{P-AP}$ controls whether a write operation changes the magnetization state of the free layer 422 from AP to a P state, or vice versa. During a read operation, the amount of current $I_{AP-P}$ or $I_{P-AP}$ is controlled by the resistance of the MTJ device 400, which depends on its magnetic state AP or P.

Another way to reduce or avoid metal redeposition on an MTJ stack pillar, during etching and over-etching, is to reduce the amount of metal material in an etched MTJ stack. For example, if the height of an MTJ stack can be reduced while achieving the desired performance, there is less metal material in the MTJ stack that may be etched and redeposited.

Figure 9:
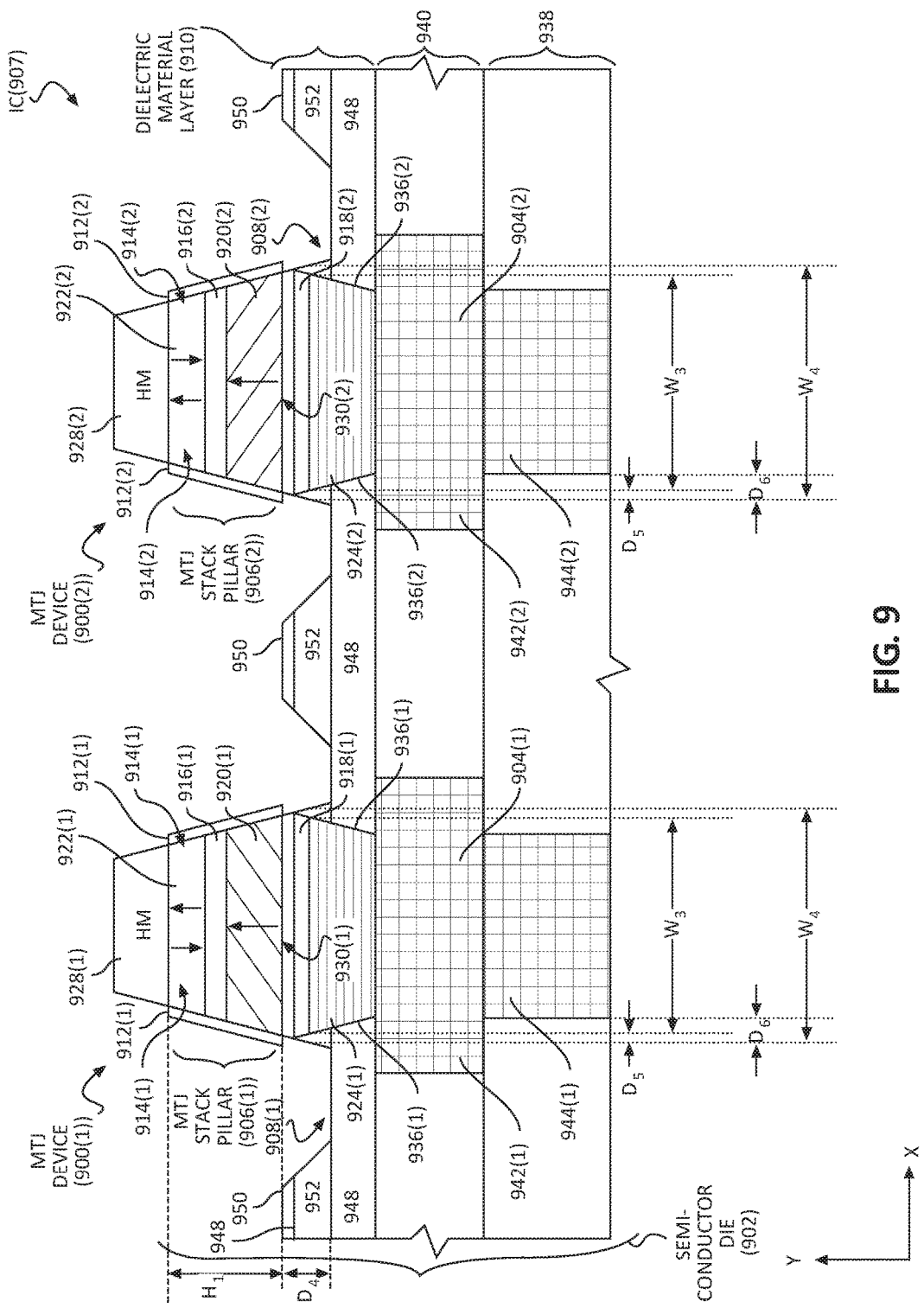
FIG. 9 is a schematic diagram of other exemplary MTJ devices with a seed layer embedded in a bottom electrode to reduce a height of an MTJ stack pillar to reduce an amount of metal material that is etched to reduce or avoid metal redeposition.

In this regard, FIG. 9 is a schematic diagram of other exemplary MTJ devices 900(1), 900(2) in a semiconductor die 902 wherein respective metal seed layers 918(1), 918(2) for providing a textured conductive coupling of MTJ stack pillars 906(1), 906(2) of the MTJ devices 900(1), 900(2) to bottom electrodes 904(1), 904(2) are embedded in the bottom electrodes 904(1), 904(2). Thus, seed layers are not included in the MTJ stack pillars 906(1), 906(2) in the MTJ devices 900(1), 900(2) in this example. As will be discussed in more detail below, the seed layers 918(1), 918(2) are embedded with the bottom electrodes 904(1), 904(2) and located below a top surface 932 of a dielectric material layer 910 to reduce the overall height $H_1$ of the MTJ stack pillars 906(1), 906(2). By reducing the height $H_1$ of the MTJ stack pillars 906(1), 906(2), the amount of metal material that is removed or etched to form the MTJ stack pillars 906(1), 906(2) can be reduced, thus avoiding or reducing the amount of metal redeposition on side walls 914(1), 914(2) of the MTJ stack pillars 906(1), 906(2).

Further, as will be discussed in more detail below, the MTJ devices 900(1), 900(2) that have the seed layers 918(1), 918(2) embedded with the bottom electrodes 904(1), 904(2) may also optionally provide for width $W_4$ of the bottom electrodes 904(1), 904(2) of the MTJ devices 900(1), 900(2) to be less than the widths $W_4$ of their respective MTJ stack pillars 906(1), 906(2) similar to the MTJ devices 400(1), 400(2) in FIG. 4. Thus, etching of the bottom electrodes 904(1), 904(2) of the MTJ devices 900(1), 900(2) during etching and/or over-etching processes may be reduced or avoided to reduce or avoid metal redeposition on the MTJ stack pillars 906(1), 906(2) from etched material of the bottom electrodes 904(1), 904(2). The etching of dielectric material 912(1), 912(2) are a result of over-etching the dielectric material layer 910, including during an over-etching process, and may be deposited on the side walls 914(1), 914(2) of the MTJ stack pillars 906(1), 906(2) as shown in FIG. 9. However, the redeposited dielectric material 912(1), 912(2) does not cause metal shorts across the layers in the MTJ stack pillars 906(1), 906(2).

In this regard, with reference to FIG. 9, the exemplary MTJ devices 900(1), 900(2) are shown in the semiconductor die 902. The semiconductor die 902 can be provided in an IC 907. The bottom electrodes 904(1), 904(2) are formed from one or more metal materials, such as Copper (Cu), Tungsten (W), Tantalum (Ta), or a Tantalum (Ta) Nitride (N) (TaN) material, as examples. As will be discussed below in more detail, when the MTJ stack pillars 906(1), 906(2) of the MTJ devices 900(1), 900(2) are formed, metal redeposition on the side walls 914(1), 914(2) may occur. Further, as will be discussed in more detail below, when the MTJ devices 900(1), 900(2) are over-etched to form over-etch trenches 908(1), 908(2) adjacent to the MTJ stack pillars 906(1), 906(2) as shown in FIG. 9, to avoid horizontal shorts between adjacent devices for example, it may be desired to avoid or reduce etching of the bottom electrodes 904(1), 904(2). The dielectric semiconductor material layer 910 adjacent to the bottom electrodes 904(1), 904(2) and the MTJ stack pillars 906(1), 906(2) is etched during over-etching. Thus, the redeposited dielectric material 912(1), 912(2) are a result of etching the dielectric material layer 910, including during an over-etching process, and may be deposited on the side walls 914(1), 914(2) of the MTJ stack pillars 906(1), 906(2) as shown in FIG. 9. However, the redeposited dielectric material 912(1), 912(2) does not cause metal shorts across the layers in the MTJ stack pillars 906(1), 906(2), including across their respective tunnel barriers 916(1), 916(2).

With continuing reference to FIG. 9, the MTJ stack pillars 906(1), 906(2) were formed from etching or other removal of materials from an MTJ stack (not shown) of material layers. The bottom electrodes 904(1), 904(2) in the MTJ devices 900(1), 900(2) in FIG. 9 include the embedded seed layers 918(1), 918(2). By embedded seed layers 918(1), 918(2), it is meant that a metal seed material is fabricated with the fabrication of the bottom electrodes 904(1), 904(2) before an MTJ stack is disposed above and in electrical contact with the bottom electrodes 904(1), 904(2), thus allowing the seed layers 918(1), 918(2) to not be included in the MTJ stack pillars 906(1), 906(2). Embedding the embedded seed layers 918(1), 918(2) with the bottom electrodes 904(1), 904(2) can allow reduced height $H_1$ of an MTJ stack that reduces the amount of metal material that is removed from an MTJ stack to from the MTJ stack pillars 906(1), 906(2). For example, the height $H_1$ of the MTJ stack pillars 906(1), 906(2) may be between approximately five (5) and twenty (20) nanometers (nm), as an example, including between approximately seven (7) and twenty (20) nanometers (nm), and approximately five (5) and fifteen (15) nanometers (nm) as non-limiting examples. In the example in FIG. 9, the bottom electrodes 904(1), 904(2) are disposed in a capping layer 948 provided in the dielectric material layer 910. The capping layer 948 may be provided for patterning openings for depositing metal materials therein to form the bottom electrodes 904(1), 904(2) and the embedded seed layers 918(1), 918(2). For example, the capping layer 948 may be a Silicon (Si) Nitride (N) (SiN) material. An additional, second seed layer 950 is disposed over the capping layer 948. The second seed layer 950 may be a thin layer that is less than twenty (20) Angstroms (A) as an example. The second seed layer 950 can be provided and processed to provide the desired textured interface to the MTJ stack pillars 906(1), 906(2) in case the process of embedding the seed layers 918(1), 918(2) does not provide the desired textured surface. For example, the embedded seed layers 918(1), 918(2) may be polished, such as through a CMP process, wherein depositing the second seed layer 950 provides a more uniform or smooth textured surface for interfacing with the MTJ stack pillars 906(1), 906(2). A CMP buffer layer 952 may be disposed over the capping layer 948 in the dielectric material layer 910 before the second seed layer 950 is provided to provide a buffer layer for polishing the second seed layer 950. When the bottom electrodes 904(1), 904(2) are formed in the capping layer 948 and the dielectric material layer 910, the second seed layer 950 is then disposed on the embedded seed layers 918(1), 918(2) to be in electrical contact with the embedded seed layers 918(1), 918(2) and thus the bottom electrodes 904(1), 904(2).

With continuing reference to FIG. 9, the MTJ stack pillars 906(1), 906(2) include pinned magnetization layers ("pinned layers") 920(1), 920(2) that are disposed above and in electrical contact with the second seed layer 950, to provide the pinned layers 920(1), 920(2) in contact with the seed layers 918(1), 918(2) and bottom electrodes 904(1), 904(2). The seed layers 918(1), 918(2) provide textured surfaces to promote smooth and epitaxial crystal growth of the pinned layers 920(1), 920(2) in a specific desired orientation to provide desired magnetic properties. The second seed layer 950 and embedded seed layers 918(1), 918(2) can also be processed into a smooth surface to reduce roughness of that could otherwise cause uneven growth imperfections or variations in the pinned layers 920(1), 920(2) due to uneven deposition. These imperfections could propagate through the MTJ stack pillars 906(1), 906(2), thus creating "rough" surfaces at a base of the tunnel barriers 916(1), 916(2) and reducing a tunnel magnetoresistance ratio (TMR). The material chosen for the seed layers 918(1), 918(2) will depend on the materials chosen for the pinned layers 920(1), 920(2). For example, the seed layers 918(1), 918(2) could be selected from metal materials, such as Platinum (Pt), Tantalum (Ta), or Ruthenium (Ru), or alloys such as Tantalum (Ta) Nitride (N) (TaN). The tunnel barriers 916(1), 916(2) are disposed above the pinned layers 920(1), 920(2). Free magnetization layers ("free layers") 922(1), 922(2) are disposed above the tunnel barriers 916(1), 916(2).

With continuing reference to FIG. 9, as discussed above, the bottom electrodes 904(1), 904(2) may be provided of a smaller width than the MTJ stack pillars 906(1), 906(2) to avoid or reduce etching of the bottom electrodes 904(1), 904(2) from causing metal redeposition on the MTJ stack pillars 906(1), 906(2). Thus, for example, as shown in FIG. 9, the widths $W_3$ of the bottom electrodes 904(1), 904(2) may be deemed a largest cross-section width of the bottom electrodes 904(1), 904(2) if the bottom electrodes 904(1), 904(2) do not have a straight vertical profile in the Y direction. For example, the widths $W_3$ of the bottom electrodes 904(1), 904(2) may be between fifteen (15) and fifty (50) nanometers (nm) as non-limiting examples. Further, the bottom electrodes 904(1), 904(2) may be made of a metal material 924(1), 924(2), such as Tungsten (W). Further, the widths $W_4$ of the MTJ stack pillars 906(1), 906(2) labeled in FIG. 9 are the largest cross-section widths of the MTJ stack pillars 906(1), 906(2) since the MTJ stack pillars 906(1), 906(2) do not have a completely vertical profile as a result of etching in this example. For example, the widths $W_4$ of the MTJ stack pillars 906(1), 906(2) may be between twenty (20) and sixty (60) nanometers (nm) as non-limiting examples. Hard masks (HM) 928(1), 928(2) disposed above MTJ stack pillars 906(1), 906(2) control the shape of the etched and formed MTJ stack pillars 906(1), 906(2), and thus may control the distances and locations of the over-etch trenches 908(1), 908(2) formed in the dielectric material layer 910.

With continuing reference to FIG. 9, the over-etch trenches 908(1), 908(2) may extend a depth $D_4$ below bottom surfaces 930(1), 930(2) of the MTJ stack pillars 906(1), 906(2). For example, the bottom surfaces 930(1), 930(2) of the MTJ stack pillars 906(1), 906(2) may be bottom surfaces of the pinned layers 920(1), 920(2) at the interface between the second seed layer 950. For example, this depth $D_4$ may be between approximately five (5) and twenty (20) nanometers (nm). Note that the over-etch trenches 908(1), 908(2) in this example do not extend into the bottom electrodes 904(1), 904(2), because the bottom electrodes 904(1), 904(2) are reduced in the horizontal direction X due to their reduced widths $W_3$ as discussed above. The over-etch trenches 908(1), 908(2) are disposed a minimum distance $D_5$ from outer surfaces 936(1), 936(2) of the bottom electrodes 904(1), 904(2). The distance between the over-etch trenches 908(1), 908(2) and the outer surfaces 936(1), 936(2) of the bottom electrodes 904(1), 904(2) may vary between the minimum distance $D_5$ and a maximum distance $D_6$ if the etch profile of the over-etch trenches 908(1), 908(2) is not straight in the vertical Y direction, as shown in FIG. 9. As an example, minimum distance $D_5$ between the over-etch trenches 908(1), 908(2) and the outer surfaces 936(1), 936(2) of the bottom electrodes 904(1), 904(2) may be at least two (2) nanometers (nm). As an example, maximum distance $D_6$ between the over-etch trenches 908(1), 908(2) and the outer surfaces 936(1), 936(2) of the bottom electrodes 904(1), 904(2) may be at least five (5) nanometers (nm). The over-etch trenches 908(1), 908(2) may also extend below the dielectric material layer 910 into a lower metal layer 940 (e.g., a metal 2 (M2) or metal 3 (M3) layer) and/or an inter-metal block layer 938 that contains vertical interconnect accesses (VIAs) 944(1), 944(2) interconnected to metal islands 942(1), 942(2) in the lower metal layer 940.

Figure 10:
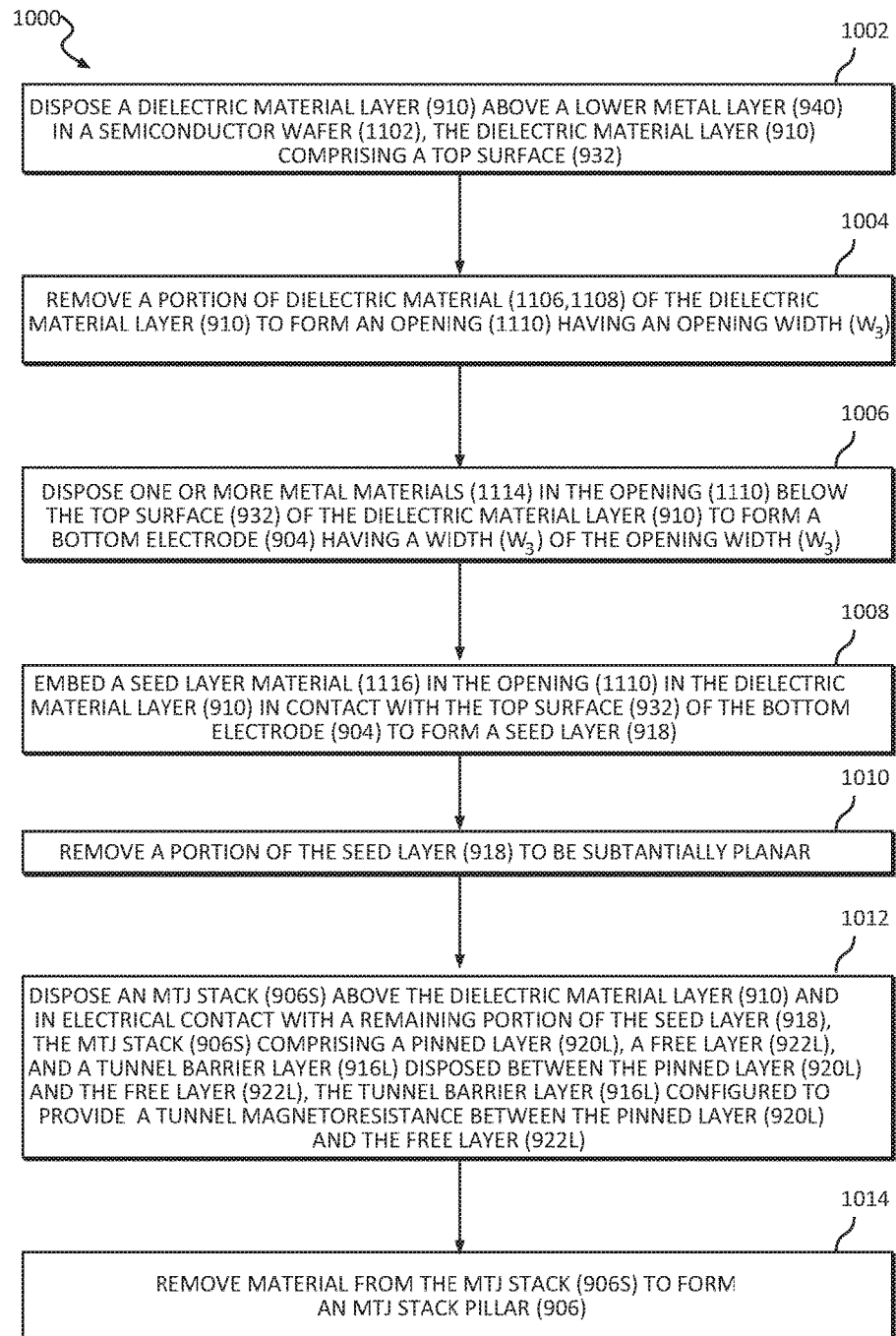
FIG. 10 is flowchart illustrating an exemplary process of fabricating the MTJ devices in FIG. 9, including etching of an MTJ stack to form an MTJ stack pillar and over-etching of the MTJ devices to avoid horizontal shorts between an adjacent device.

To further discuss fabrication of an MTJ device that has an MTJ stack pillar having a larger width than the width of its bottom electrode, such as the MTJ devices 900(1), 900(2) in FIG. 9, FIGS. 10-11G are provided. FIG. 10 is a flowchart illustrating an exemplary process 1000 of fabricating an MTJ device, such as the MTJ devices 900(1), 900(2) in FIG. 9. FIGS. 11A-11G illustrate exemplary process stages 1100(1)-1100(7) during the fabrication of the MTJ device 900 in a semiconductor wafer 1102 according to the exemplary process 1000 in FIG. 10. The details discussed above with regard to the exemplary MTJ devices 900(1), 900(2) in FIG. 9 are also applicable to the MTJ device 900 fabricated in the process stages 1100(1)-1100(7) in FIGS. 11A-11G, and thus will not be repeated. Common elements between the MTJ devices 900(1), 900(2) in FIG. 9 and elements shown in the process stages 1100(1)-1100(7) in FIGS. 11A-11G are shown with common element numbers.

Figure 11A:
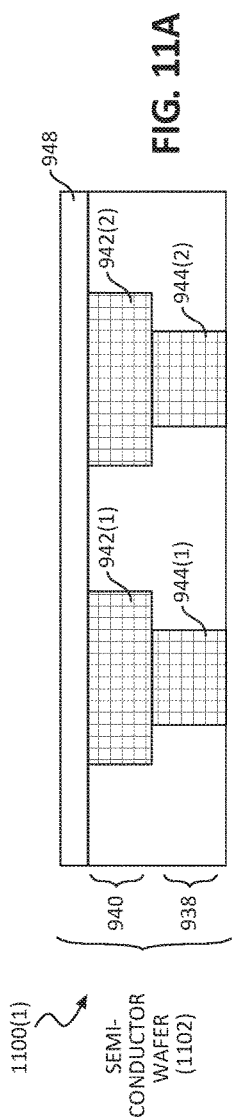

In this regard, FIG. 11A illustrates a first exemplary process stage 1100(1) of fabricating an MTJ device that will have an embedded seed layer with a bottom electrode to reduce the height of an MTJ stack pillar. As shown in FIG. 11A, the dielectric material layer 910 is disposed above the lower metal layer 940 and the inter-metal block layer 938 in a semiconductor wafer 1102 (block 1002 in FIG. 10). In this example, the capping layer 948 is disposed above the lower metal layer 940 and the inter-metal block layer 938 in the semiconductor wafer 1102. A top surface 932 will be formed on the dielectric material layer 910.

Figure 11B:
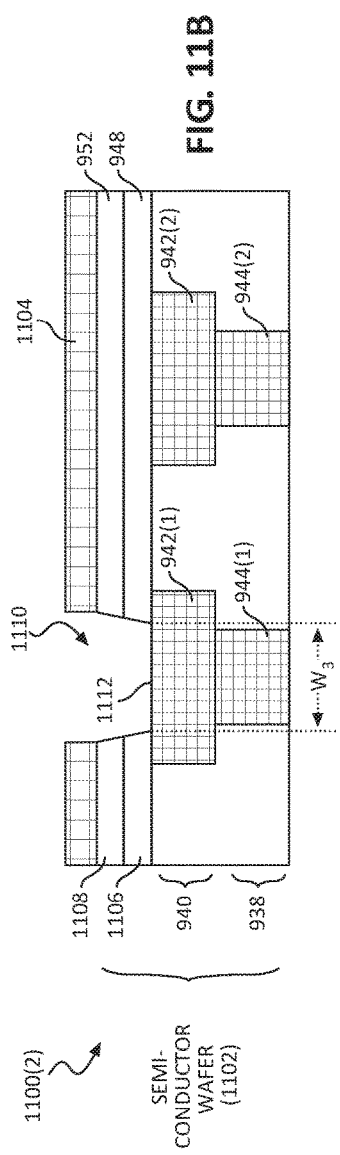
Figure 11C:
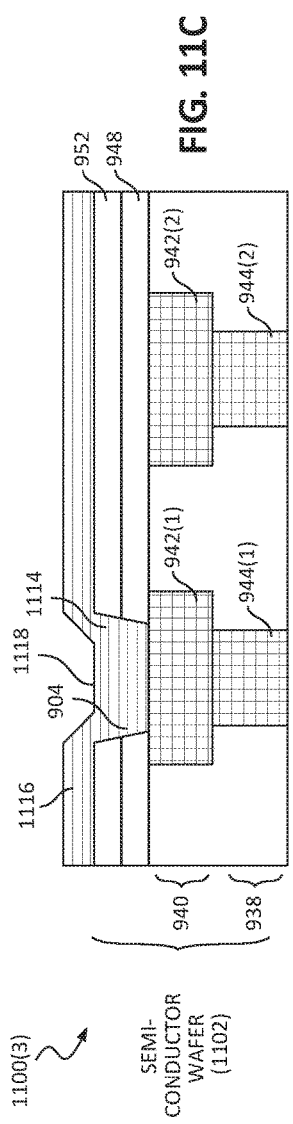

Further, as shown in an exemplary process stage 1100(2) in FIG. 11B, the CMP buffer layer 952 is optionally disposed on the capping layer 948 to provide a layer for performing CMP as previously discussed. A patterned layer 1104 is then disposed above the CMP buffer layer 952 as part of a lithography process to form the bottom electrode 904 as shown in FIG. 11C. In this regard, a portion of dielectric materials 1106, 1108 from the capping layer 948 and the CMP buffer layer 952 are removed to form an opening 1110 having an opening width $W_3$ (block 1004 in FIG. 10). The dielectric materials 1106, 1108 may be etched according to the patterned layer 1104 to form the opening 1110. A top surface 1112 of the metal island 942(1) may form an etch stop for etching of the dielectric materials 1106, 1108 to form the opening 1110.

Figure 12A:
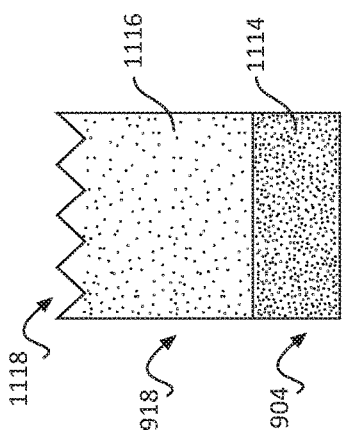
FIGS. 12A-12C illustrate an exemplary process of processing a seed layer embedded with a bottom electrode of an MTJ device to form a textured surface for depositing a perpendicular magnetic anisotropy (PMA) layer as part of an MTJ stack of the MTJ device.
Figure 12B:
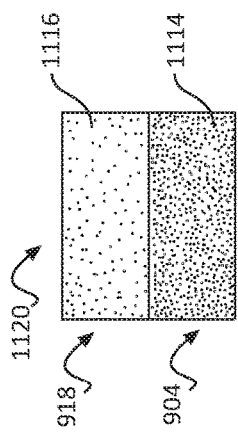

Thereafter, as shown in an exemplary process stage 1100(3) in FIG. 11C, one or more metal materials 1114 are disposed in the opening 1110 to form the bottom electrode 904 also having the opening width $W_3$ (block 1006 in FIG. 10). A seed layer material 1116 is then disposed in the opening 1110 to be embedded with the metal material(s) 1114, forming the bottom electrode 904 (block 1008 in FIG. 10). This is also shown in FIG. 12A. Note that opening 1110 in the process stage 1100(3) in FIG. 12C extends to through the lower metal layer 940, because the bottom electrode 904 will be electrically connected to another device in the semiconductor wafer 1102 through the lower metal layer 940 in this example. Note that the initial deposition of the seed layer material 1116 may form a high rough top surface 1118 because of the thickness of the seed layer material 1116 (e.g., 10-20 nanometers (nm)) embedded with the bottom electrode 904 in the opening. This is also shown in FIG. 11C, where the seed layer material 1116 extends outside of the opening 1110. Thus, as shown in an exemplary process stage 1100(4) in FIG. 11D, a CMP process may be performed to planarize the seed layer 918 formed from the seed layer material 1116 (block 1010 in FIG. 10). The seed layer 918 may be planarized to form a smooth surface 1120 embedded with the bottom electrode 904 to be substantially planar to the top surface 932 of the CMP buffer layer 952, as shown in FIG. 11D, and also in FIG. 12B.

Figure 12C:
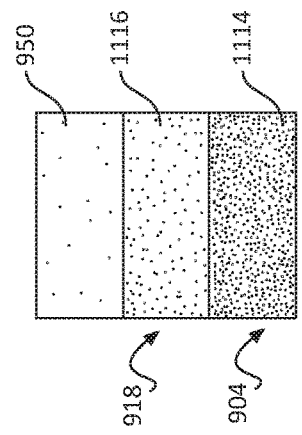

Next, as shown in an exemplary process stage 600(5) in FIG. 11E, the optional second seed layer 950 is disposed above the CMP buffer layer 952 and the embedded seed layer 918. As discussed above, the second seed layer 950 may be provided for texture enhancement for coupling to the pinned layers 920(1), 920(2) of the MTJ stack pillars 906(1), 906(2), as shown in FIG. 9. This is also shown in FIG. 12C. The second seed layer 950 and embedded seed layer 918 can also be processed into a smooth surface to reduce roughness of that could otherwise cause uneven growth imperfections or variations in the pinned layers 920(1), 920(2) (see FIG. 9) due to uneven deposition. These imperfections could propagate through the MTJ stack pillars 906(1), 906(2) shown in FIG. 9, thus creating "rough" surfaces at a base of the tunnel barriers 916(1), 916(2) and reducing a tunnel magnetoresistance ratio (TMR).

Next, as shown in an exemplary process stage 1100(6) in FIG. 11F, an MTJ stack 906S of a width larger than the opening width $W_3$ of the opening 1110 is disposed above and in electrical contact with the bottom electrode 904 (block 1012 in FIG. 10). The MTJ stack 906S comprises a plurality of layers that have not yet been further processed, such as etched, to form MTJ stack pillars for MTJ devices. For example, the MTJ stack 906S may be fifteen (15) nanometers (nm) as an example, and with a reduced height because the seed layer 918 is not included and instead embedded with the bottom electrode 904. The MTJ stack 906S comprises a pinned layer 920L disposed above the second seed layer 950 and the seed layer 918, a tunnel barrier layer 916L disposed above the pinned layer 920L, and a free layer 922L disposed above the tunnel barrier layer 916L. The tunnel barrier layer 916L is configured to provide a tunnel magnetoresistance between the pinned layer 920L and the free layer 922L. After the MTJ stack 906S is disposed on the dielectric material layer 910 in contact with the seed layer(s) 950, 918 and the bottom electrode 904, the MTJ stack 906S may be annealed as an example to provide the desired electrical properties in the MTJ stack 906S. A hard mask layer 928L may then be disposed on the MTJ stack 406S to protect portions of the MTJ stack 406S during etching, such as IBE, to form an MTJ stack pillar, as shown in the process stage 1100(4) in FIG. 11D.

Note that in this example, the pinned layer 920L of the MTJ stack 906S as shown in FIG. 11F is disposed below the tunnel barrier layer 916L, and the free layer 922L is disposed above the tunnel barrier layer 916L. However, note that in the alternative, the pinned layer 920L could be disposed above the tunnel barrier layer 916L, with the free layer 922L disposed below the tunnel barrier layer 916L.

Figure 11G:
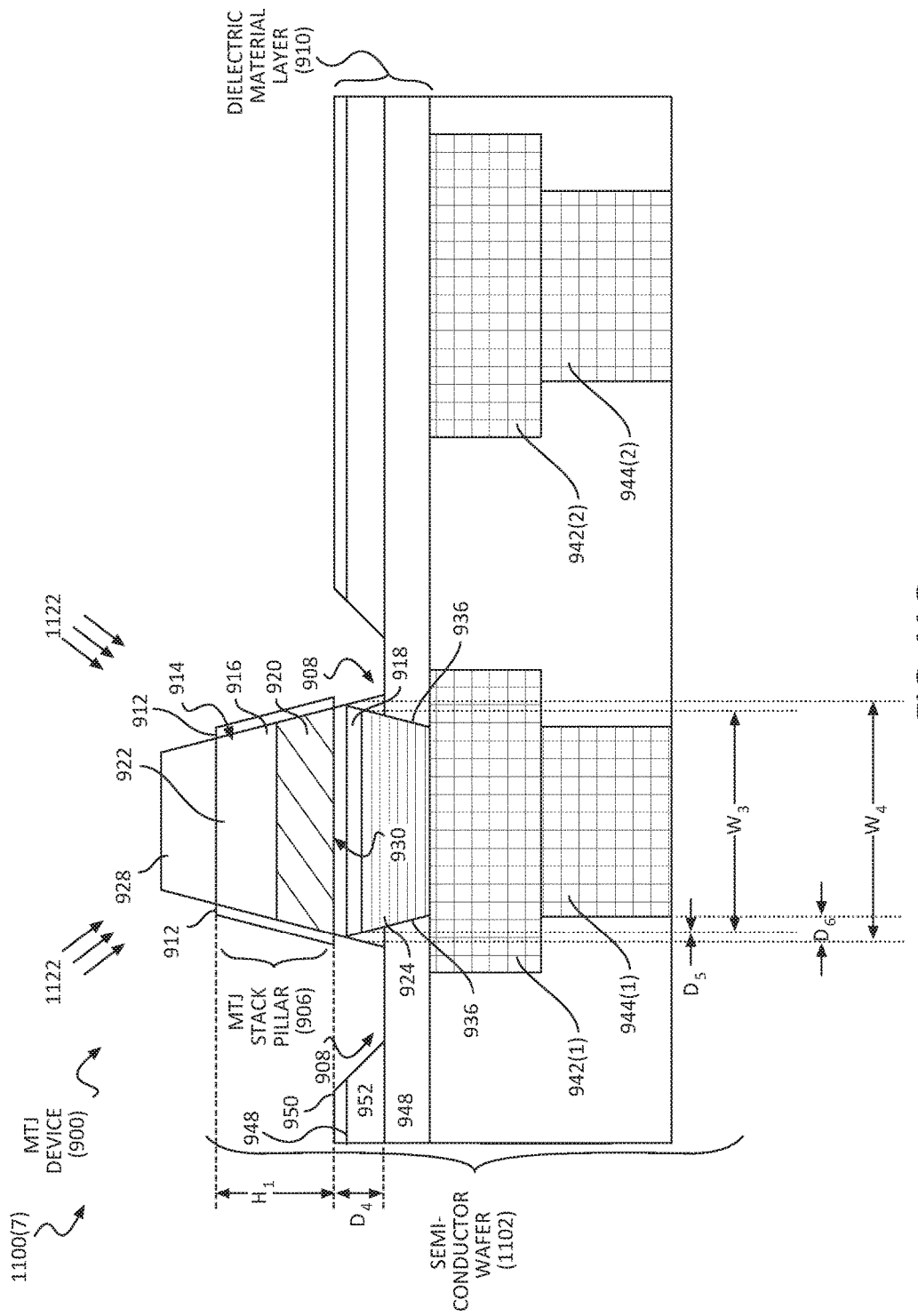

As shown in an exemplary process stage 1100(7) in FIG. 11G, material is removed from the MTJ stack 906S to form the MTJ stack pillar 906 and having a width $W_4$ larger than the width $W_3$ of the bottom electrode 904 (block 1014 in FIG. 10). For example, a lithography process may be used to form openings in a hard mask layer (not shown) to then remove portions of the hard mask layer to leave a remaining hard mask 928 above the location where the MTJ stack pillar 906 is to be formed. Then, as an example, an ion beam 1122 may be directed toward the MTJ stack 906S in FIG. 11F to form the MTJ stack pillar 906 shown in FIG. 11G to form the MTJ device 900. The hard mask 928 protects the MTJ stack 906S to be etched at the desired width characteristics. Then, as also shown in the exemplary process stage 1100(7) in FIG. 11G, an over-etching process may be employed to form the over-etch trenches 908 to avoid or reduce horizontal metal shorts between adjacent devices as previously described and shown in FIG. 9.

Figure 13:
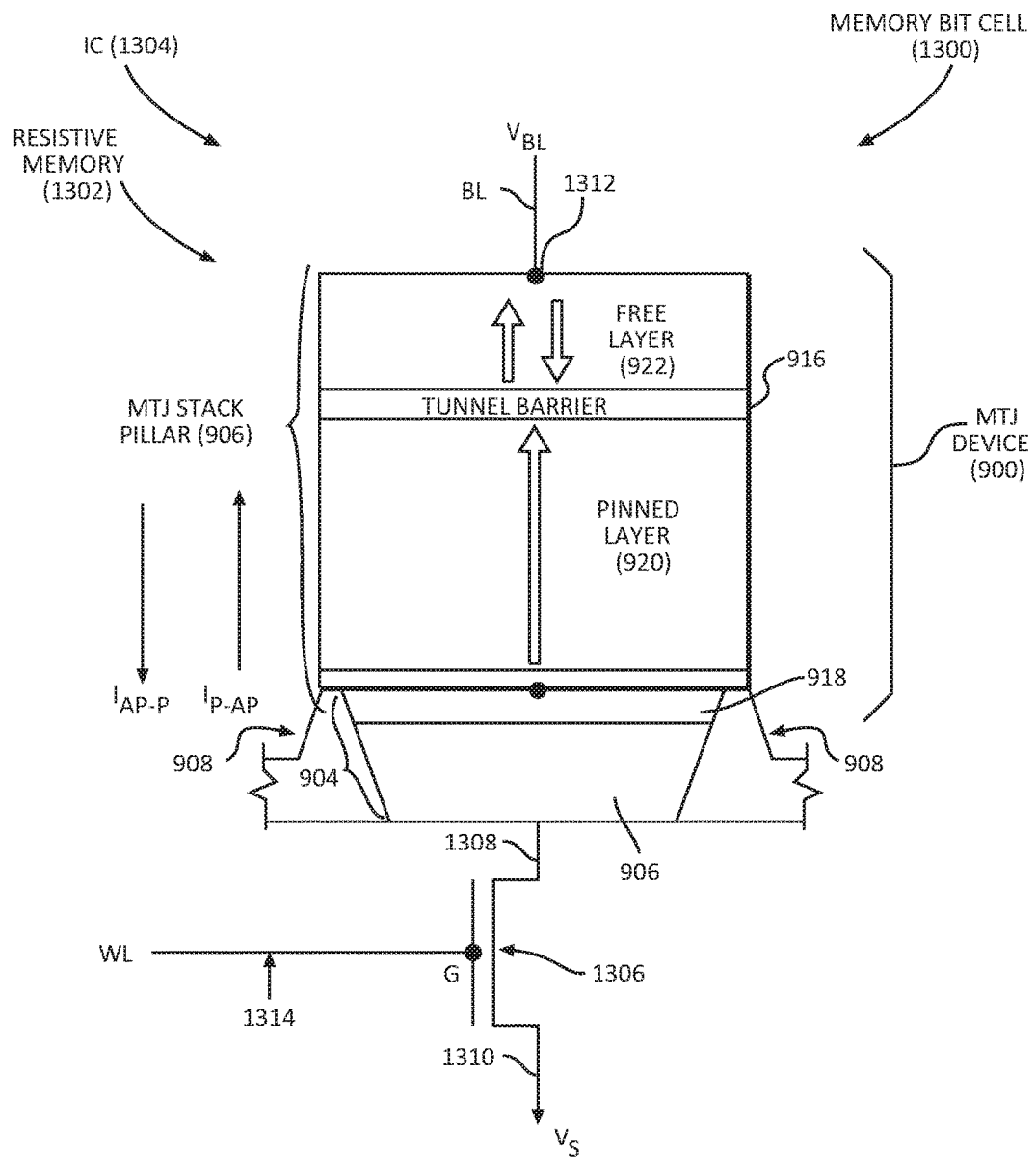
FIG. 13 is a schematic diagram of an MRAM bit cell employing an MTJ device with a seed layer embedded in a bottom electrode to reduce a height of an MTJ stack pillar to reduce an amount of metal material that can be etched to reduce or avoid metal redeposition.

FIG. 13 is a schematic diagram of a memory bit cell 1300 employing the MTJ device 900 in FIG. 11G as a storage element when used in a resistive memory 1302, such as an MRAM, for example. The resistive memory 1302 may be included in an IC 1304. As shown in FIG. 13, the memory bit cell 1300 includes an access transistor 1306 for controlling read and write operations to the MTJ device 900 acting as a storage element. The access transistor 1306 is provided in the form of an NMOS transistor in this example, that includes a gate (G) coupled to a word line (WL), a first electrode 1308 (e.g., a drain), and a second electrode 1310 (e.g., a source). The bottom electrode 904 of the MTJ device 900 is coupled to the first electrode 1308 of the access transistor 1306. A top electrode 1312 is electrically coupled to the free layer 922 of the MTJ device 900 and to a bit line (BL) to couple the MTJ device 900 to the bit line (BL). When accessing the MTJ device 900, the MTJ device 900 is configured to receive a current $I_{AP-P}$ or $I_{P-AP}$ flowing between the top and bottom electrodes 1312, 904 as a result of the voltage differential between a voltage ($V_{BL}$) coupled to the bit line (BL) and a voltage ($V_S$) coupled to the bottom electrode 904 when a signal 1314 on the word line (WL) activates the access transistor 1306 to couple the voltage ($V_S$) coupled to the bottom electrode 904. The amount of current $I_{AP-P}$ or $I_{P-AP}$ is controlled by voltage ($V_{BL}$) and voltage ($V_S$) and whether the operation is a read or write operation. Write operations take more current to change the magnetization state of the free layer 922. The direction of the current $I_{AP-P}$ or $I_{P-AP}$ controls whether a write operation changes the magnetization state of the free layer 922 from AP to a P state, or vice versa. During a read operation, the amount of current $I_{AP-P}$ or $I_{P-AP}$ is controlled by the resistance of the MTJ device 900, which depends on its magnetic state AP or P.

MTJ devices with reduced or avoided metal redeposition from etching and/or over-etching, including MTJ devices having a bottom electrode with a width less than the MTJ stack to avoid or reduce etching of the bottom electrode during over-etching of the MTJ device, and/or having a seed layer embedded in the bottom electrode to reduce the height of the MTJ stack pillar to reduce the amount of metal material that can be over-etched, may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 14:
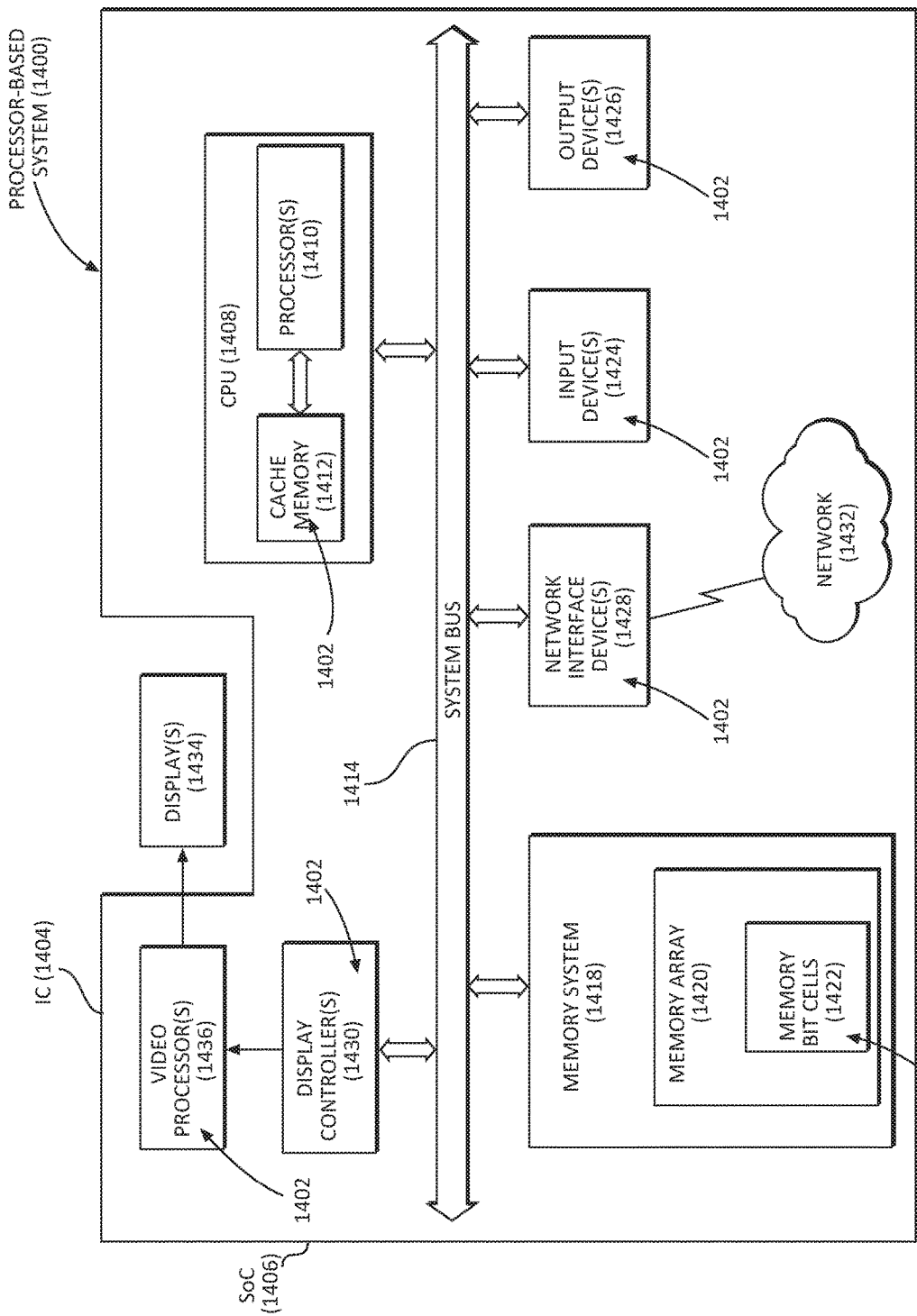
FIG. 14 is a block diagram of an exemplary processor-based system that includes MTJ devices with reduced or avoided metal redeposition from etching, and according to the exemplary aspects disclosed herein.

In this regard, FIG. 14 illustrates an example of a processor-based system 1400 that can include MTJ devices 1402 with reduced or avoided metal redeposition from etching and/or over-etching, including MTJ devices having a bottom electrode with a width less than the MTJ stack pillar to avoid or reduce etching of the bottom electrode during over-etching of the MTJ device, and/or having a seed layer embedded in the bottom electrode to reduce the height of the MTJ stack pillar to reduce the amount of metal material that can be over-etched. These MTJ devices 1402 can include the MTJ devices 400(1)-400(2), 900(1)-900(2) in FIGS. 4 and 9, respectively, as non-limiting examples.

In this example, the processor-based system 1400 is provided in an IC 1404. The IC 1404 may be included in or provided as a system-on-a-chip (SoC) 1406. The processor-based system 1400 includes a CPU 1408 that includes one or more processors 1410. The CPU 1408 may have a cache memory 1412 coupled to the processor(s) 1410 for rapid access to temporarily stored data. The cache memory 1412 may include the MTJ devices 1402 for providing memory bit cells for storage of data. The CPU 1408 is coupled to a system bus 1414 and can intercouple master and slave devices included in the processor-based system 1400. As is well known, the CPU 1408 communicates with these other devices by exchanging address, control, and data information over the system bus 1414. Although not illustrated in FIG. 14, multiple system buses 1414 could be provided, wherein each system bus 1414 constitutes a different fabric. For example, the CPU 1408 can communicate bus transaction requests to a memory system 1418 as an example of a slave device. The memory system 1418 may include a memory array 1420 that include memory bit cells 1422 that includes the MTJ devices 1402 as an example.

Other master and slave devices can be connected to the system bus 1414. As illustrated in FIG. 14, these devices can include the memory system 1418, and one or more input devices 1424, which can include the MTJ devices 1402. The input device(s) 1424 can include any type of input device, including but not limited to input keys, switches, voice processors, etc. These other devices can also include one or more output devices 1426, and one or more network interface devices 1428, both of which can include the MTJ devices 1402 as an example. The output device(s) 1426 can include any type of output device, including but not limited to audio, video, other visual indicators, etc. These other devices can also include one or more display controllers 1430 as examples. The network interface device(s) 1428 can be any devices configured to allow exchange of data to and from a network 1432. The network 1432 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1428 can be configured to support any type of communications protocol desired.

The CPU 1408 may also be configured to access the display controller(s) 1430 over the system bus 1414 to control information sent to one or more displays 1434. The display controller(s) 1430 sends information to the display(s) 1434 to be displayed via one or more video processors 1436, which process the information to be displayed into a format suitable for the display(s) 1434. The video processor(s) 1436 can include the MTJ devices 1402 as an example. The display(s) 1434 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magnetic tunnel junction (MTJ) device, comprising:
   a bottom electrode having a width and a top surface;
   a dielectric material layer disposed adjacent to the bottom electrode and at least partially below the top surface of the bottom electrode;
   a seed layer;
   an MTJ stack pillar disposed above the dielectric material layer, the MTJ stack pillar having a width larger than the width of the bottom electrode and disposed above and in electrical contact with the bottom electrode, the MTJ stack pillar comprising:
      a pinned layer disposed above the seed layer;
      a free layer disposed above the seed layer; and
      a tunnel barrier disposed between the pinned layer and the free layer, the tunnel barrier configured to provide a tunnel magnetoresistance between the pinned layer and the free layer; and
   an over-etch trench disposed in the dielectric material layer adjacent to the MTJ stack pillar and extending below the top surface of the bottom electrode, wherein the over-etch trench does not extend into the bottom electrode.

2. The MTJ device of claim 1, further comprising a redeposited dielectric material from the dielectric material layer adjacent to an outer surface of the MTJ stack pillar.

3. The MTJ device of claim 1, wherein the width of the bottom electrode comprises a largest cross-section width of the bottom electrode.

4. The MTJ device of claim 1, wherein the width of the MTJ stack pillar comprises a largest cross-section width of the MTJ stack pillar.

5. The MTJ device of claim 1, further comprising:
   a lower metal layer, the bottom electrode disposed above the lower metal layer; and
   an inter-metal block layer disposed between the dielectric material layer and the lower metal layer, the bottom electrode further disposed adjacent to the inter-metal block layer.

6. The MTJ device of claim 1, wherein the MTJ stack pillar comprises the seed layer.

7. The MTJ device of claim 1, further comprising the dielectric material layer comprising a top surface, and wherein:
   the bottom electrode is disposed in an opening in the dielectric material layer, the top surface of the bottom electrode disposed below the top surface of the dielectric material layer;
   the seed layer comprises an embedded seed layer disposed in the opening in the dielectric material layer in contact with the top surface of the bottom electrode; and
   the MTJ stack pillar is in electrical contact with the embedded seed layer.

8. The MTJ device of claim 7, wherein the MTJ stack pillar does not include the seed layer.

9. The MTJ device of claim 7, further comprising a redeposited dielectric material from the dielectric material layer adjacent to an outer surface of the MTJ stack pillar.

10. The MTJ device of claim 7, further comprising a second seed layer disposed above the dielectric material layer, wherein the MTJ stack pillar is disposed above and in further electrical contact with the second seed layer.

11. The MTJ device of claim 7, further comprising a lower metal layer, the bottom electrode disposed above the lower metal layer;
   wherein the dielectric material layer comprises a capping material layer disposed above the lower metal layer, and a buffer material layer disposed above the capping material layer.

12. The MTJ device of claim 1 incorporated into an MTJ bit cell, the MTJ bit cell comprising:
   an access transistor comprising a gate, a first electrode, and a second electrode, wherein:
      the gate of the access transistor is coupled to a word line;
      the bottom electrode of the MTJ device is coupled to the first electrode of the access transistor; and
      a top electrode of the MTJ device is coupled to a bit line;
   the MTJ device configured to receive a current between the first and second electrodes in response to a signal on the word line activating the access transistor and a voltage applied to the bit line.

13. The MTJ device of claim 1 integrated into an integrated circuit (IC).

14. The MTJ device of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

15. The MTJ device of claim 1, wherein:
a top plane of the over-etch trench is not substantially above a top surface of the seed layer; and
the over-etch trench has a top width greater than a bottom width.

16. The MTJ device of claim 1, wherein:
a top plane of the over-etch trench is not substantially above a top surface of the seed layer; and
the over-etch trench has a depth greater than 5 nanometers (nm).

17. The MTJ device of claim 1, wherein:
a top plane of the over-etch trench is not substantially above a top surface of the seed layer; and
the over-etch trench has a depth between 5 nanometers (nm) and 20 nm.

18. The MTJ device of claim 1, wherein the dielectric material layer disposed adjacent to the bottom electrode and at least partially below the top surface of the bottom electrode comprises the dielectric material layer in contact with the bottom electrode and at least partially below the top surface of the bottom electrode.

* * * * *